US012615026B2

(12) United States Patent
Shiraishi et al.

(10) Patent No.: US 12,615,026 B2
(45) Date of Patent: Apr. 28, 2026

(54) METHOD FOR MANUFACTURING VIBRATION ELEMENT

(71) Applicant: SEIKO EPSON CORPORATION, Tokyo (JP)

(72) Inventors: Shigeru Shiraishi, Ina (JP); Hiyori Sakata, Minowa (JP); Keiichi Yamaguchi, Ina (JP); Ryuta Nishizawa, Nagano (JP)

(73) Assignee: SEIKO EPSON CORPORATION (JP)

( * ) Notice: Subject to any disclaimer, the term of this patent is extended or adjusted under 35 U.S.C. 154(b) by 639 days.

(21) Appl. No.: 17/970,645

(22) Filed: Oct. 21, 2022

(65) Prior Publication Data

US 2023/0126632 A1 Apr. 27, 2023

(30) Foreign Application Priority Data

Oct. 22, 2021 (JP) ................................. 2021-172913

(51) Int. Cl.
*H03H 3/02* (2006.01)
*H03H 9/215* (2006.01)
(52) U.S. Cl.
CPC .............. *H03H 3/02* (2013.01); *H03H 9/215* (2013.01); *H03H 2003/026* (2013.01)
(58) Field of Classification Search
CPC ..... H03H 2003/026; H03H 3/02; H03H 9/215
See application file for complete search history.

(56) References Cited

U.S. PATENT DOCUMENTS

| | | | |
|---|---|---|---|
| 2016/0225978 A1* | 8/2016 | Kan | H03H 3/04 |
| 2022/0271725 A1 | 8/2022 | Sakata et al. | |
| 2022/0271735 A1 | 8/2022 | Sakata et al. | |
| 2023/0126632 A1* | 4/2023 | Shiraishi | H03H 9/215 29/25.35 |
| 2023/0134199 A1 | 5/2023 | Yamaguchi et al. | |

FOREIGN PATENT DOCUMENTS

| | | |
|---|---|---|
| JP | 2007-013382 A | 1/2007 |
| JP | 2008-205657 A | 9/2008 |
| JP | 2013-175933 A | 9/2013 |
| JP | 2018-148380 A | 9/2018 |

* cited by examiner

*Primary Examiner* — Minh N Trinh
(74) *Attorney, Agent, or Firm* — Harness, Dickey & Pierce, P.L.C.

(57) ABSTRACT

A method for manufacturing a vibration element includes, a first base film forming step of forming a first base film at a first substrate surface of a quartz crystal substrate in first and second vibrating arm forming regions, a first protective film forming step of forming a first protective film in a first bank portion forming region of the first base film, a first dry-etching step of dry-etching the quartz crystal substrate through the first base film and the first protective film, a second base film forming step of forming a second base film at a second substrate surface of the quartz crystal substrate in the first and second vibrating arm forming regions, a second protective film forming step of forming a second protective film in a second bank portion forming region of the second base film, and a second dry-etching step of dry-etching the quartz crystal substrate through the second base film and the second protective film.

6 Claims, 21 Drawing Sheets

METHOD FOR MANUFACTURING VIBRATION ELEMENT

The present application is based on, and claims priority from JP Application Serial Number 2021-172913, filed Oct. 22, 2021, the disclosure of which is hereby incorporated by reference herein in its entirety.

BACKGROUND

1. Technical Field

The present disclosure relates to a method for manufacturing a vibration element.

2. Related Art

JP-A-2013-175933 discloses a method for forming a tuning fork type vibrator having a bottomed groove in a vibrating arm by wet-etching and dry-etching. In this manufacturing method, a quartz crystal substrate is wet-etched into an outer shape of the tuning fork type vibrator, and then the groove is formed by the dry-etching.

JP-A-2007-013382 discloses a method for forming a tuning fork type vibrator having a bottomed groove in a vibrating arm by dry-etching. In this manufacturing method, when a substrate made of a piezoelectric material is dry-etched, by using a micro loading effect, a width of the groove is narrowed with respect to a width between a pair of vibrating arms to make an etching depth of the groove smaller than an etching depth between the pair of vibrating arms, so that the groove and an outer shape of the vibrator are collectively formed.

In the manufacturing method of JP-A-2013-175933, since the wet-etching for forming the outer shape and the dry-etching for forming the groove are separate steps, manufacturing steps are complicated, and displacement of the groove with respect to the outer shape, or the like is likely to occur. Therefore, there is a problem in that in a vibration element manufactured by this manufacturing method, unnecessary vibration or the like is likely to occur.

On the other hand, in the manufacturing method of JP-A-2007-013382, since the outer shape and the groove are collectively formed in the same step, the above-described problem does not occur. However, in this manufacturing method, since the outer shape and the groove are collectively formed by the micro loading effect in the dry-etching, there is a problem that a setting of dimensions such as the width of the vibrating arm and the width and the depth of the groove is restricted, resulting in low degree of freedom in design.

Therefore, there is a demand for a method for manufacturing a vibration element capable of collectively forming an outer shape and a groove and having high degree of freedom in design.

SUMMARY

A method for manufacturing a vibration element according to an aspect of the present disclosure is a method for manufacturing a vibration element including a first vibrating arm and a second vibrating arm extending along a first direction and arranged side by side along a second direction intersecting the first direction. The first vibrating arm and the second vibrating arm each have a first surface and a second surface arranged side by side in a third direction intersecting the first direction and the second direction in a front and back relationship, a bottomed first groove opening to the first surface, and a bottomed second groove opening to the second surface. The method for manufacturing a vibration element include: a preparing step of preparing a quartz crystal substrate having a first substrate surface and a second substrate surface in a front and back relationship; a first base film forming step of forming a first base film at the first substrate surface in a first vibrating arm forming region in which the first vibrating arm is to be formed and a second vibrating arm forming region in which the second vibrating arm is to be formed; a first protective film forming step of forming a first protective film in a region of the first base film excluding a first groove forming region in which the first groove is to be formed; a first dry-etching step of dry-etching the quartz crystal substrate from a first substrate surface side through the first base film and the first protective film to form the first surfaces, the first grooves, and outer shapes of the first vibrating arm and the second vibrating arm; a second base film forming step of forming a second base film at the second substrate surface in the first vibrating arm forming region and the second vibrating arm forming region; a second protective film forming step of forming a second protective film in a region of the second base film excluding a second groove forming region in which the second groove is to be formed; and a second dry-etching step of dry-etching the quartz crystal substrate from a second substrate surface side through the second base film and the second protective film to form the second surfaces, the second grooves, and the outer shapes of the first vibrating arm and the second vibrating arm.

BRIEF DESCRIPTION OF THE DRAWINGS

FIG. 2 is a cross-sectional view taken along a line A1-A1 in FIG. 1.

FIG. 5 is a cross-sectional view showing a method for manufacturing the vibration element.

FIG. 6 is a cross-sectional view showing the method for manufacturing the vibration element.

FIG. 25 is a cross-sectional view showing the method for manufacturing the vibration element.

FIG. 31 is a plan view showing a modification of the vibration element.

DESCRIPTION OF EXEMPLARY EMBODIMENTS

1. First Embodiment

A method for manufacturing a vibration element 1 according to a first embodiment will be described.

First, a configuration of the vibration element 1 will be described with reference to FIGS. 1 and 2, and then the method for manufacturing the vibration element 1 will be described with reference to FIGS. 3 to 20.

Figure 3:
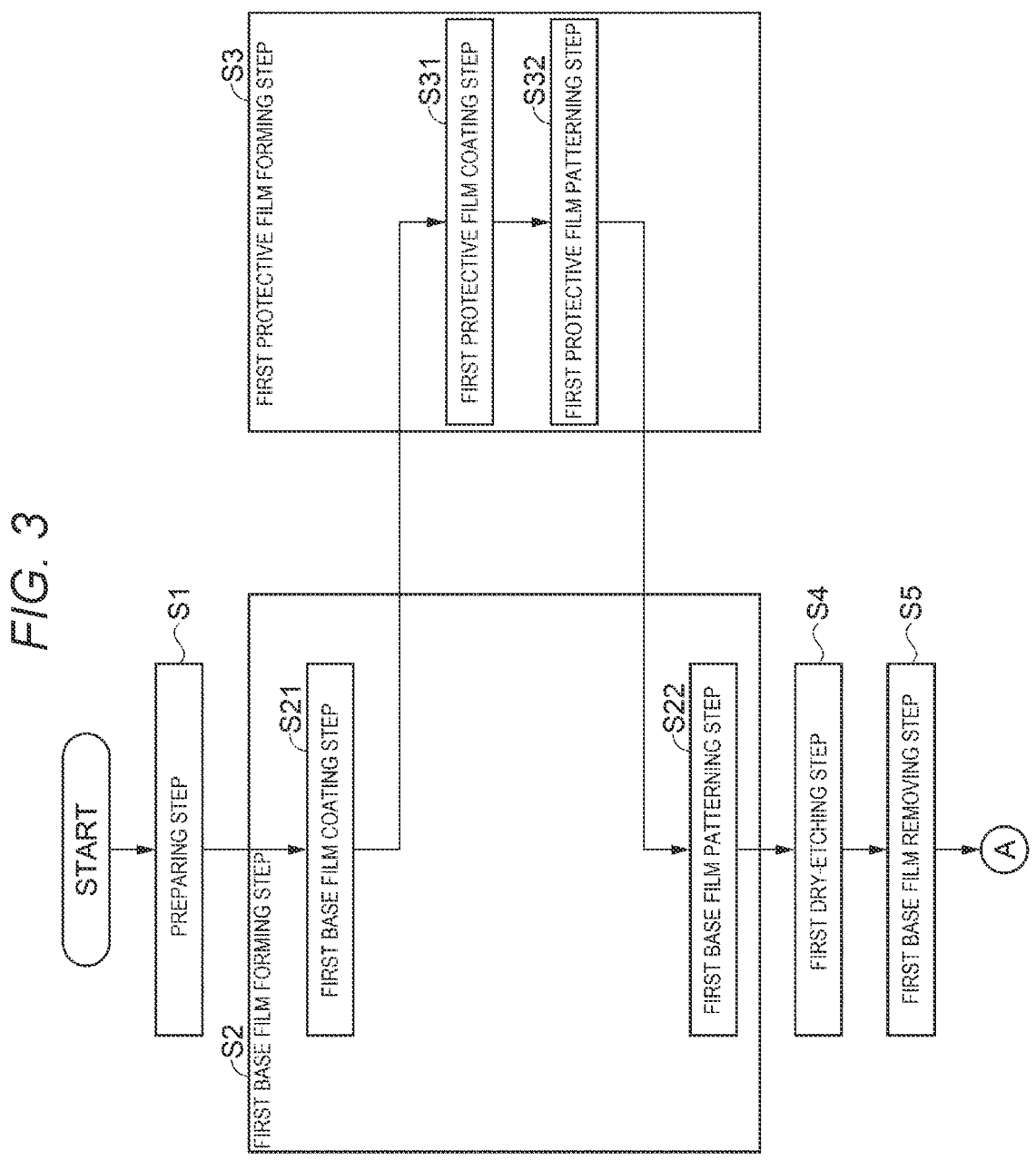
FIG. 3 is a diagram showing steps for manufacturing the vibration element according to the first embodiment.
Figure 4:
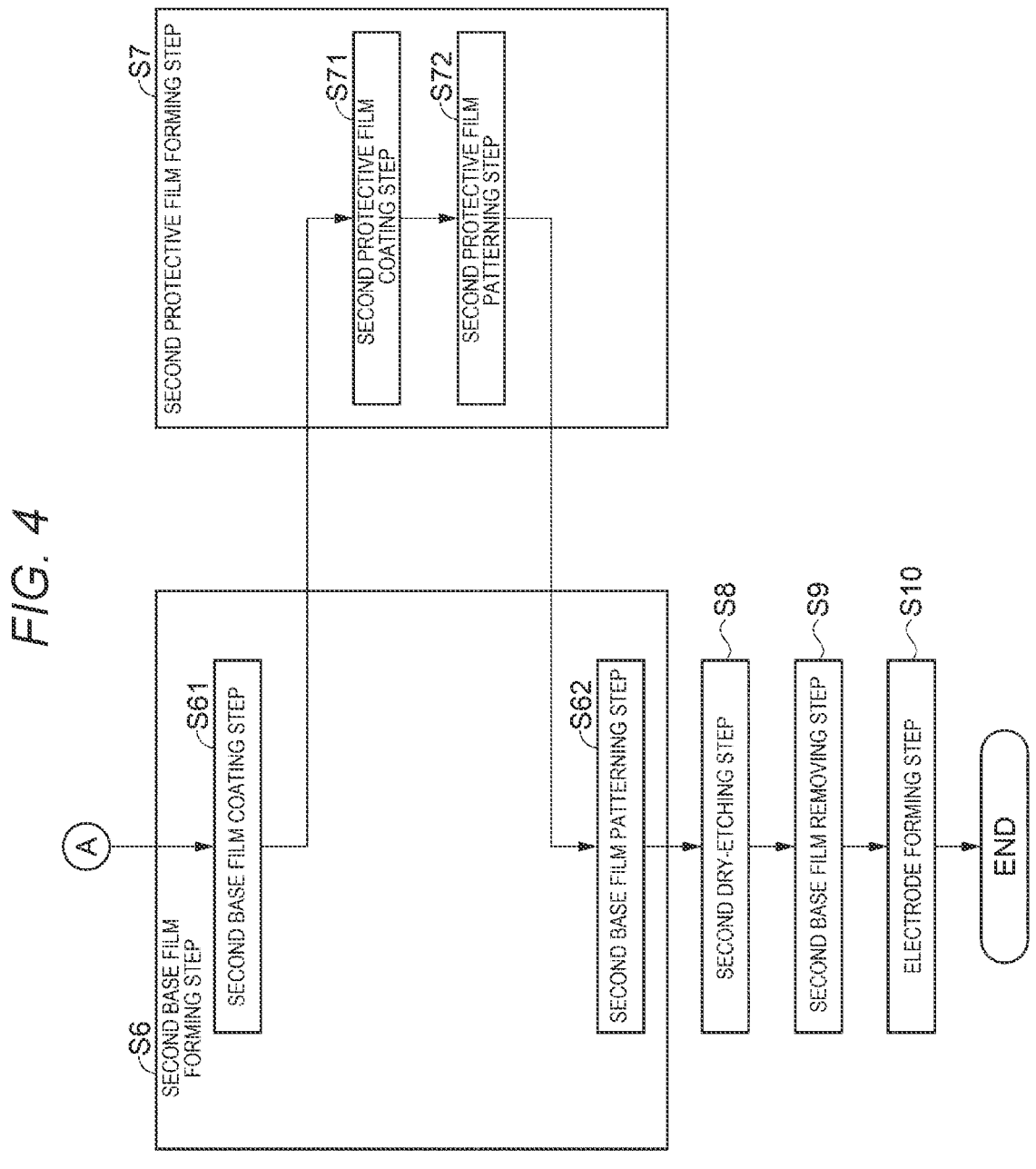
FIG. 4 is a diagram showing steps for manufacturing the vibration element according to the first embodiment.

For convenience of description, each figure except for FIGS. 3 and 4 shows three axes orthogonal to one another, that is, an X axis, a Y axis, and a Z axis. In addition, a direction along the X axis as a second direction is also referred to as an X direction, a direction along the Y axis as a first direction is also referred to as a Y direction, and a direction along the Z axis as a third direction is also referred to as a Z direction. An arrow side of each axis is also referred to a plus side, and an opposite side is also referred to a minus side. In addition, the plus side in the Z direction is also referred to as "upper", and the minus side is also referred to as "lower". In addition, a plan view from the Z direction is also simply referred to as a "plan view". In addition, the X axis, the Y axis, and the Z axis correspond to crystal axes of a quartz crystal, as will be described later.

Figure 1:
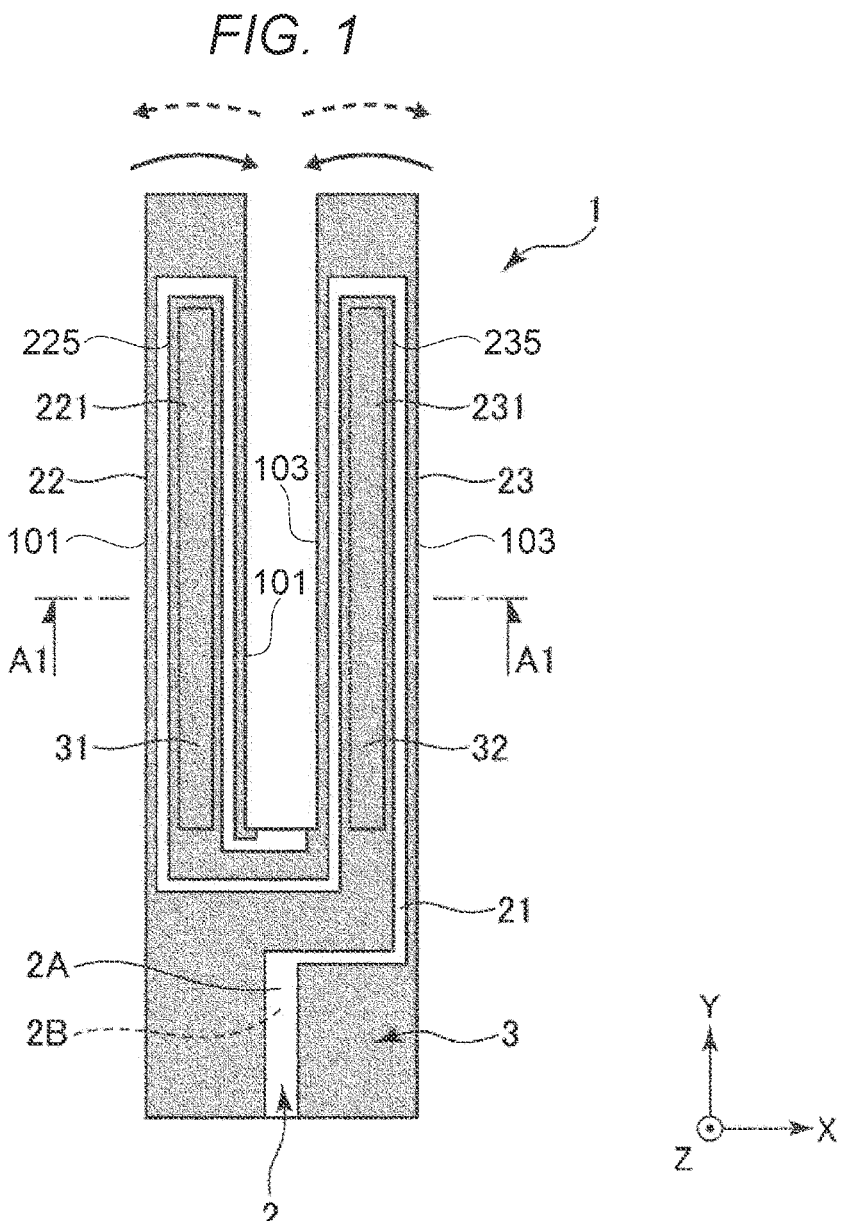
FIG. 1 is a plan view showing a vibration element according to a first embodiment.
Figure 2:
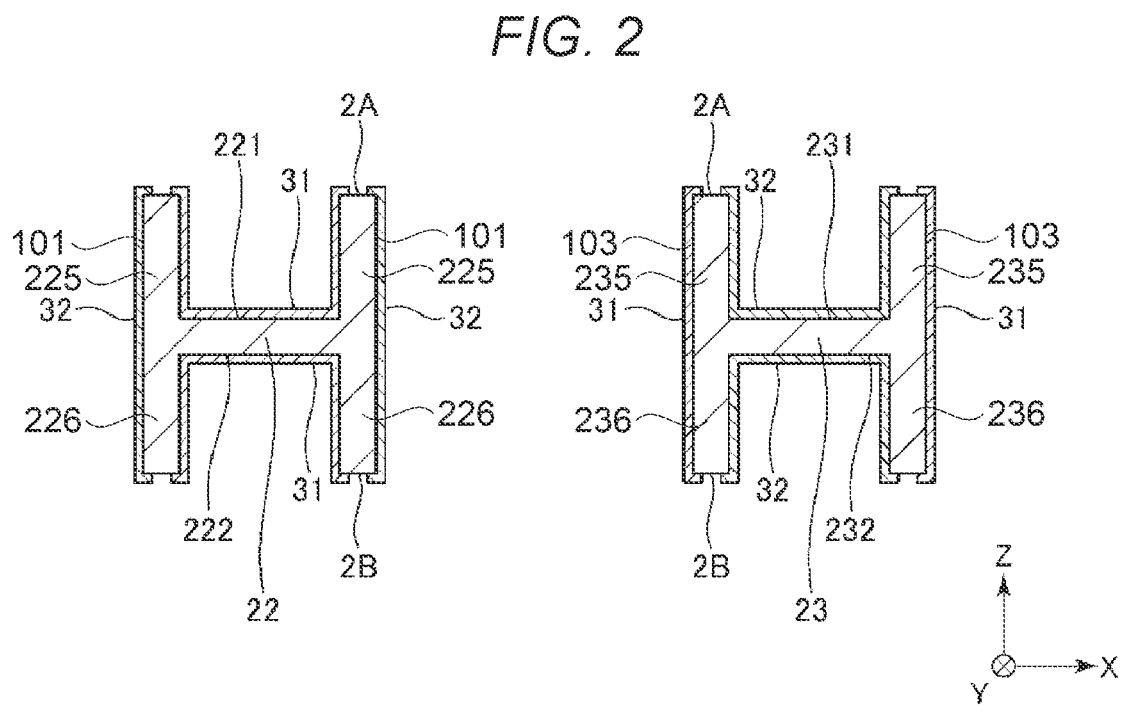

As shown in FIGS. 1 and 2, the vibration element 1 is a tuning fork type vibration element, and includes a vibration substrate 2 and an electrode 3 formed on a surface of the vibration substrate 2.

The vibration substrate 2 is formed by patterning a Z-cut quartz crystal substrate as a Z-cut quartz crystal plate into a desired shape, has a spread in an X-Y plane defined by the X axis and the Y axis which are the crystal axes of the quartz crystal, and has a thickness along the Z direction. The X axis is also referred to as an electrical axis, the Y axis is also referred to as a mechanical axis, and the Z axis is also referred to as an optical axis. In addition, the thickness along the Z direction is also simply referred to as a "thickness".

The vibration substrate 2 is formed in a plate shape, and has a first surface 2A and a second surface 2B which are arranged side by side in the Z direction in a mutual front and back relationship. The vibration substrate 2 includes a base portion 21, and a first vibrating arm 22 and a second vibrating arm 23 extending from the base portion 21 along the Y direction and arranged side by side along the X direction.

The first vibrating arm 22 includes a bottomed first groove 221 that opens to the first surface 2A, a first bank portion 225 that demarcates the first groove 221, a bottomed second groove 222 that opens to the second surface 2B, a second bank portion 226 that demarcates the second groove 222, and a side surface 101 that couples the first surface 2A and the second surface 2B. The first bank portion 225 is a portion arranged side by side on the first surface 2A in the plan view with the first groove 221 interposed therebetween along the X direction. The second bank portion 226 is a portion arranged side by side on the second surface 2B in the plan view with the second groove 222 interposed therebetween along the X direction.

Similarly, the second vibrating arm 23 includes a bottomed first groove 231 that opens to the first surface 2A, a first bank portion 235 that demarcates the first groove 231, a bottomed second groove 232 that opens to the second surface 2B, a second bank portion 236 that demarcates the second groove 232, and a side surface 103 that couples the first surface 2A and the second surface 2B. The first bank portion 235 is a portion arranged side by side on the first surface 2A in the plan view with the first groove 231 interposed therebetween along the X direction. The second bank portion 236 is a portion arranged side by side on the second surface 2B in the plan view with the second groove 232 interposed therebetween along the X direction.

The first grooves 221, 231 and the second grooves 222, 232 extend along the Y direction. In addition, the first bank portions 225, 235 are formed on both sides of the first grooves 221, 231 in the X direction, respectively, and extend along the Y direction. The second bank portions 226, 236 are formed on both sides of the second grooves 222, 232 in the X direction, respectively, and extend along the Y direction. Therefore, each of the first vibrating arm 22 and the second vibrating arm 23 has a substantially H-shaped cross-sectional shape. Accordingly, a thermoelasticity loss is reduced, and the vibration element 1 has an excellent vibration characteristic.

The electrode 3 includes signal electrodes 31 and ground electrodes 32. The signal electrodes 31 are disposed on the first surface 2A and the second surface 2B of the first vibrating arm 22 and the side surface 103 of the second vibrating arm 23. On the other hand, the ground electrodes 32 are disposed on the side surface 101 of the first vibrating arm 22 and the first surface 2A and the second surface 2B of the second vibrating arm 23. When a drive signal is applied to the signal electrodes 31 in a state where the ground electrodes 32 are grounded, as shown by arrows in FIG. 1, the first vibrating arm 22 and the second vibrating arm 23 perform flexural vibration in the X direction so as to repeatedly approach to and separate from each other.

The vibration element 1 is briefly described above.

Next, the method for manufacturing the vibration element 1 will be described. As shown in FIGS. 3 and 4, the method for manufacturing the vibration element 1 includes: a preparing step S1 of preparing a quartz crystal substrate 20 which is a base material of the vibration substrate 2; a first base film forming step S2 of forming a first base film 51 in a predetermined region of a first substrate surface 20A of the quartz crystal substrate 20; a first protective film forming step S3 of forming a first protective film 53 in a predetermined region of the first base film 51; a first dry-etching step S4 of dry-etching the quartz crystal substrate 20 from a first substrate surface 20A side through the first base film 51 and the first protective film 53; a first base film removing step S5 of removing the first base film 51 remaining on the first substrate surface 20A of the quartz crystal substrate 20; a second base film forming step S6 of forming a second base film 61 in a predetermined region of a second substrate surface 20B of the quartz crystal substrate 20; a second protective film forming step S7 of forming a second protective film 63 in a predetermined region of the second base film 61; a second dry-etching step S8 of dry-etching the quartz crystal substrate 20 from a second substrate surface 20B side through the second base film 61 and the second protective film 63; a second base film removing step S9 of removing the second base film 61 remaining on the second substrate surface 20B of the quartz crystal substrate 20; and an electrode forming step S10 of forming the electrode 3 on a front surface of the vibration substrate 2 obtained by the above steps.

The first base film forming step S2 includes a first base film coating step S21 of coating the first substrate surface 20A of the quartz crystal substrate 20 with the first base film 51, and a first base film patterning step S22 of patterning the first base film 51. The first protective film forming step S3 includes a first protective film coating step S31 of coating the first base film 51 with the first protective film 53, and a first protective film patterning step S32 of patterning the first protective film 53.

The second base film forming step S6 includes a second base film coating step S61 of coating the second substrate surface 20B of the quartz crystal substrate 20 with the second base film 61, and a second base film patterning step S62 of patterning the second base film 61. The second protective film forming step S7 includes a second protective film coating step S71 of coating the second base film 61 with the second protective film 63, and a second protective film patterning step S72 of patterning the second protective film 63.

Hereinafter, these steps will be described in order.

Preparing Step S1

Figures 5, 6:
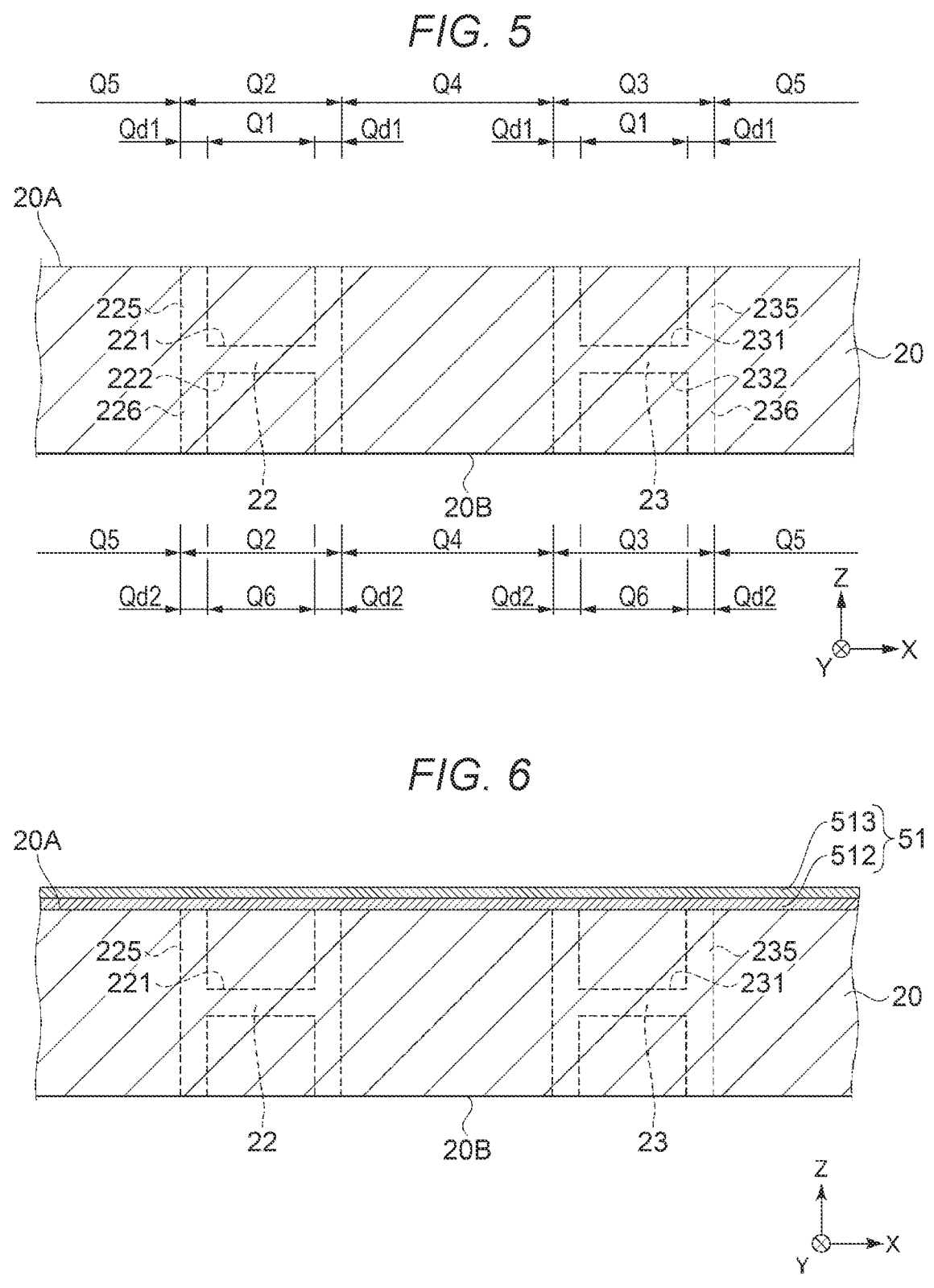

As shown in FIG. 5, the quartz crystal substrate 20, which is the base material of the vibration substrate 2, is prepared. A plurality of vibration elements 1 are collectively formed from the quartz crystal substrate 20. The quartz crystal substrate 20 is formed in a plate shape, and has the first substrate surface 20A and the second substrate surface 20B which are arranged side by side in the Z direction in a mutual front and back relationship. The quartz crystal substrate 20 is adjusted to a desired thickness by polishing treatment such as lapping or polishing, and the first substrate surface 20A and the second substrate surface 20B are sufficiently smoothed. In addition, if necessary, the quartz crystal substrate 20 may be subjected to a surface treatment by wet etching.

Hereinafter, a region in which the first vibrating arm 22 is to be formed by the first dry-etching step S4 and the second dry-etching step S8 to be described later is also referred to as a first vibrating arm forming region Q2. Similarly, a region in which the second vibrating arm 23 is to be formed by the first dry-etching step S4 and the second dry-etching step S8 is also referred to as a second vibrating arm forming region Q3. A region located between the first vibrating arm forming region Q2 and the second vibrating arm forming region Q3 is also referred to as an inter-arm region Q4. In addition, a region located between adjacent vibration substrates 2 is also referred to as an inter-element region Q5.

The first vibrating arm forming region Q2 and the second vibrating arm forming region Q3 include first groove forming regions Q1 in which the first grooves 221, 231 are respectively formed, and first bank portion forming regions Qd1 in which the first bank portions 223, 235 are respectively formed. In other words, the first bank portion forming regions Qd1 correspond to regions of the first vibrating arm forming region Q2 and the second vibrating arm forming region Q3 excluding the first groove forming regions Q1. The first grooves 221, 231 and the first bank portions 225, 235 are formed by the first dry-etching step S4.

The first vibrating arm forming region Q2 and the second vibrating arm forming region Q3 further include second groove forming regions Q6 in which the second grooves 222, 232 are respectively formed by the second dry-etching step S8, and second bank portion forming regions Qd2 in which the second bank portions 226, 236 are respectively formed. In other words, the second bank portion forming regions Qd2 correspond to regions of the first vibrating arm forming region Q2 and the second vibrating arm forming region Q3 excluding the second groove forming regions Q6. The second groove 222, 232 and the second bank portion 226, 236 are formed by the second dry-etching step S8.

First Base Film Coating Step S21

As shown in FIG. 6, the first substrate surface 20A of the quartz crystal substrate 20 is coated with the first base film 51. The first base film 51 is formed of a material that is etched at a predetermined etching rate in the first dry-etching step S4 to be described later.

In the present embodiment, the first base film 51 is a metal film formed of metal. Specifically, the first base film 51 is formed by stacking a first metal film 512 and a second metal film 513. The first metal film 512 is formed on the first substrate surface 20A of the quartz crystal substrate 20. The second metal film 513 is formed on a surface of the first metal film 512 on a side opposite to the quartz crystal substrate 20. The surface of the first metal film 512 on the side opposite to the quartz crystal substrate 20 is a surface of the first metal film 512 on the plus side in the Z direction. The first metal film 512 is formed of chromium (Cr). The second metal film 513 is formed of copper (Cu).

In the present embodiment, the first base film 51 is formed by stacking the first metal film 512 and the second metal film 513, but the disclosure is not limited thereto, and the first base film 51 may be formed of one film, or may be formed by stacking three or more films. The first base film 51 may be formed of a material other than metal. For example, the first base film 51 may be a resist film formed of a resist material.

First Protective Film Coating Step S31

Figure 7:
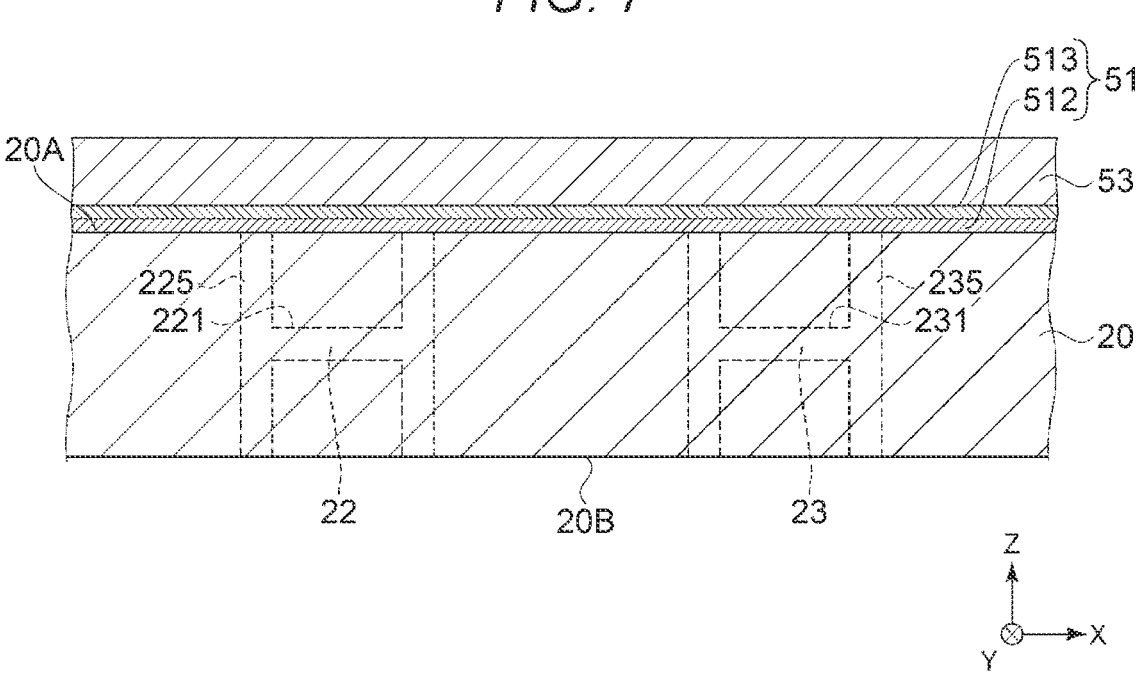
FIG. 7 is a cross-sectional view showing the method for manufacturing the vibration element.

As shown in FIG. 7, the first base film 51 is coated with the first protective film 53. The first protective film 53 is formed on a surface of the first base film 51 on the side opposite to the quartz crystal substrate 20. The surface of the first base film 51 on the side opposite to the quartz crystal substrate 20 is a surface of the first base film 51 on the plus side in the Z direction. The first protective film 53 is formed of a material that is etched at a predetermined etching rate in the first dry-etching step S4 to be described later.

In the present embodiment, the first protective film 53 is a metal film formed of metal. As the metal forming the first protective film 53, for example, nickel (Ni) can be used. The first protective film 53 may be formed of a material other than metal. For example, the first protective film 53 may be a resist film formed of a resist material.

First Protective Film Patterning Step S32

Figure 8:
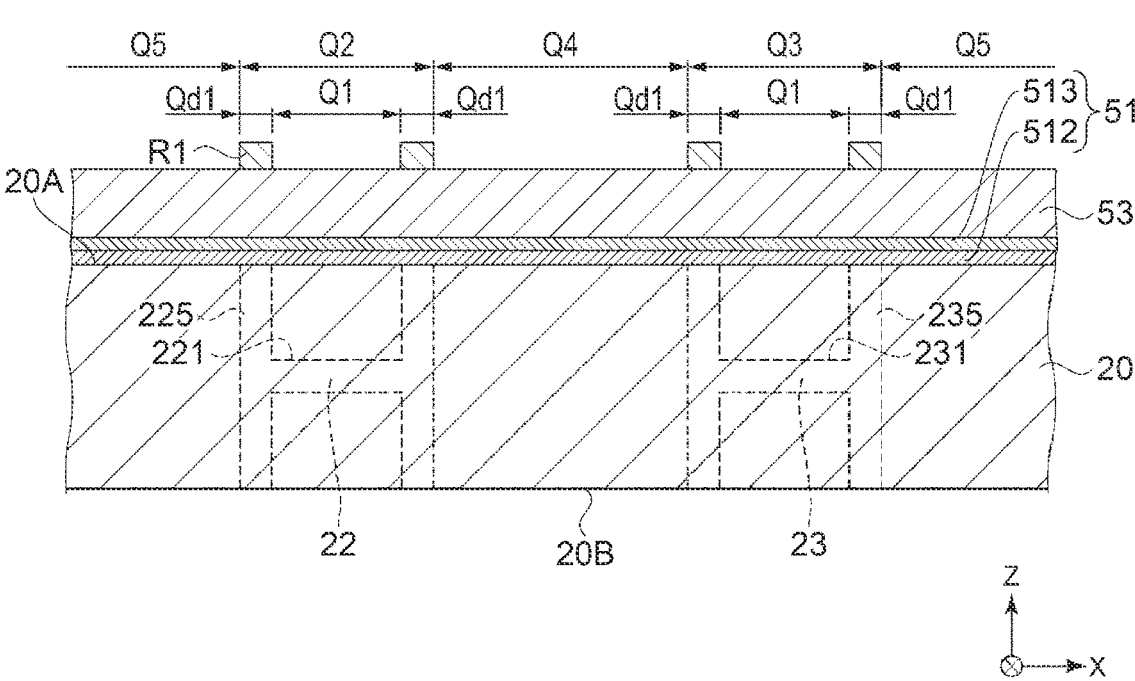
FIG. 8 is a cross-sectional view showing the method for manufacturing the vibration element.

First, as shown in FIG. 8, a first resist film R1 is formed on a surface of the first protective film 53 on the side opposite to the quartz crystal substrate 20. The surface of the first protective film 53 on the side opposite to the quartz crystal substrate 20 is a surface of the first protective film 53 on the plus side in the Z direction. The first resist film R1 is formed in the first bank portion forming regions Qd1 by a photolithographic technique. That is, the first resist film R1 overlaps the first bank portion forming regions Qd1 in the plan view.

Next, the first protective film 53 is etched from a surface side of the first protective film 53 on which the first resist film R1 is formed. That is, the first protective film 53 is etched from a surface side of the first protective film 53 on the plus side in the Z direction using the first resist film R1 as a mask. As a result, the first protective film 53 in the first groove forming regions Q1, the inter-arm region Q4, and the inter-element regions Q5 in which the first resist film R1 is not formed is removed.

Figure 9:
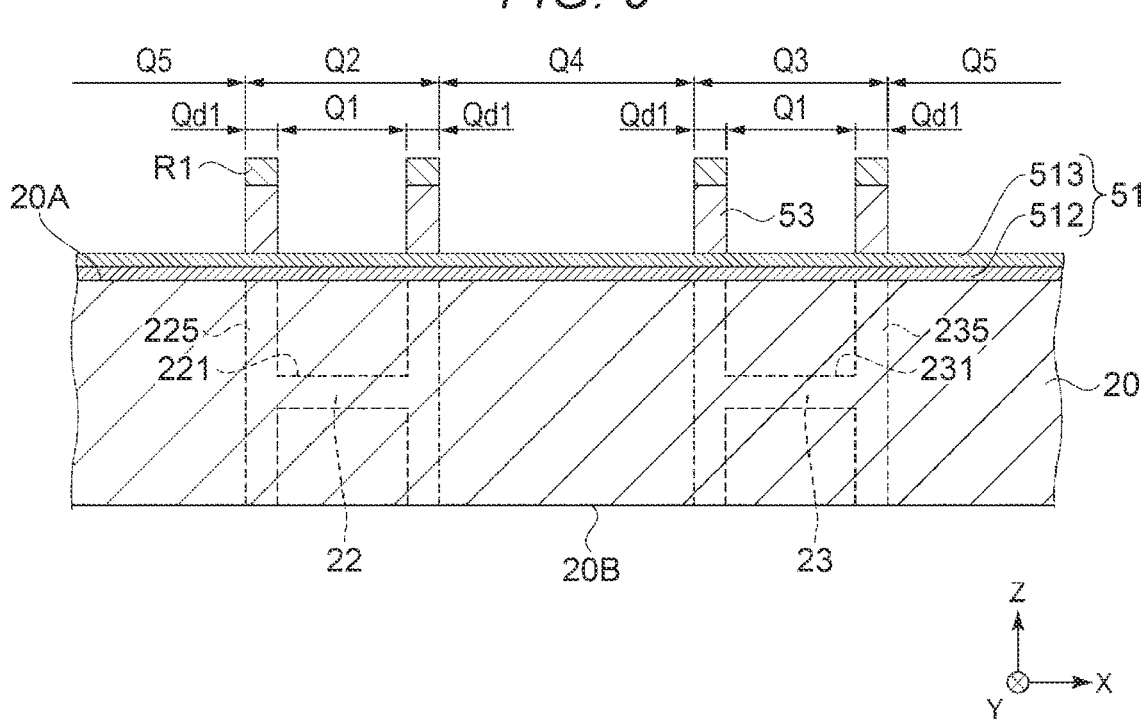
FIG. 9 is a cross-sectional view showing the method for manufacturing the vibration element.

In this manner, as shown in FIG. 9, the first protective film 53 can be formed in the first bank portion forming regions Qd1 which are the predetermined regions of the first base film 51.

Figure 10:
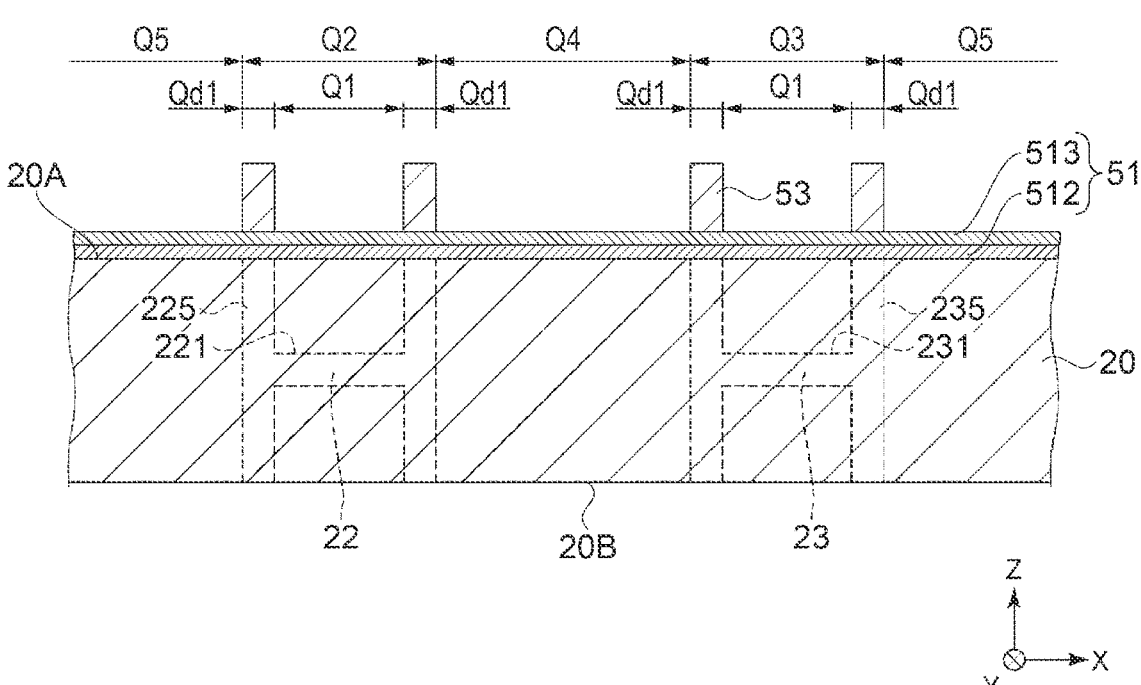
FIG. 10 is a cross-sectional view showing the method for manufacturing the vibration element.

Next, as shown in FIG. 10, the first resist film R1 is removed, and the process proceeds to the first base film patterning step S22.

First Base Film Patterning Step S22

The first base film patterning step S22 includes a step of forming a second resist film R2 in the first vibrating arm forming region Q2 and the second vibrating arm forming region Q3, and a step of etching the first base film 51 using the second resist film R2 as a mask.

Figure 11:
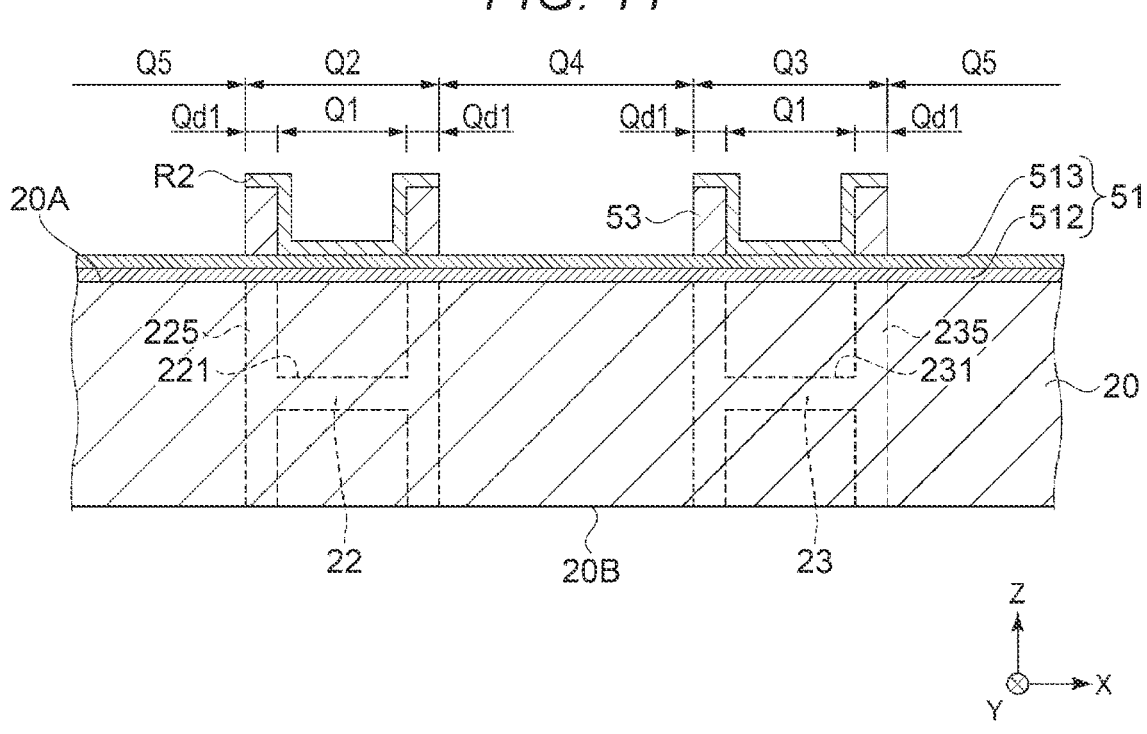
FIG. 11 is a cross-sectional view showing the method for manufacturing the vibration element.

First, as shown in FIG. 11, the second resist film R2 is formed in the first vibrating arm forming region Q2 and the second vibrating arm forming region Q3 of the surface of the first base film 51 on the side opposite to the quartz crystal substrate 20 by the photolithographic technique.

In the present embodiment, the first protective film coating step S31 and the first protective film patterning step S32 are performed before the first base film patterning step S22, and the first protective film 53 is formed in the first bank portion forming regions Qd1 of the first vibrating arm forming region Q2 and the second vibrating arm forming region Q3. Therefore, in the first bank portion forming regions Qd1, the second resist film R2 is formed on the surface of the first base film 51 on the side opposite to the quartz crystal substrate 20 through the first protective film 53. Further, in the first groove forming regions Q1 of the first vibrating arm forming region Q2 and the second vibrating arm forming region Q3, the second resist film R2 is formed on the surface of the first base film 51 on the side opposite to the quartz crystal substrate 20 without the first protective film 53 interposed therebetween.

Next, the first base film 51 is etched from a surface side of the first base film 51 on which the second resist film R2 is formed. That is, the first base film 51 is etched from a surface side of the first base film 51 on the plus side in the Z direction using the second resist film R2 as a mask.

In the present embodiment, the step of etching the first base film 51 using the second resist film R2 as the mask includes a step of etching the first metal film 512 of the first base film 51 and a step of etching the second metal film 513 of the first base film 51. In the first base film patterning step S22, first, the second metal film 513 formed on the surface of the first metal film 512 on the side opposite to the quartz crystal substrate 20 is etched, and then the first metal film 512 is etched. In this manner, the first base film 51 formed by stacking the first metal film 512 and the second metal film 513 can be etched.

Since the second resist film R2 is formed in the first vibrating arm forming region Q2 and the second vibrating arm forming region Q3, the first base film 51 in the inter-arm region Q4 and the inter-element regions Q5 in which the second resist film R2 is not formed is removed in the first base film patterning step S22.

Figure 12:
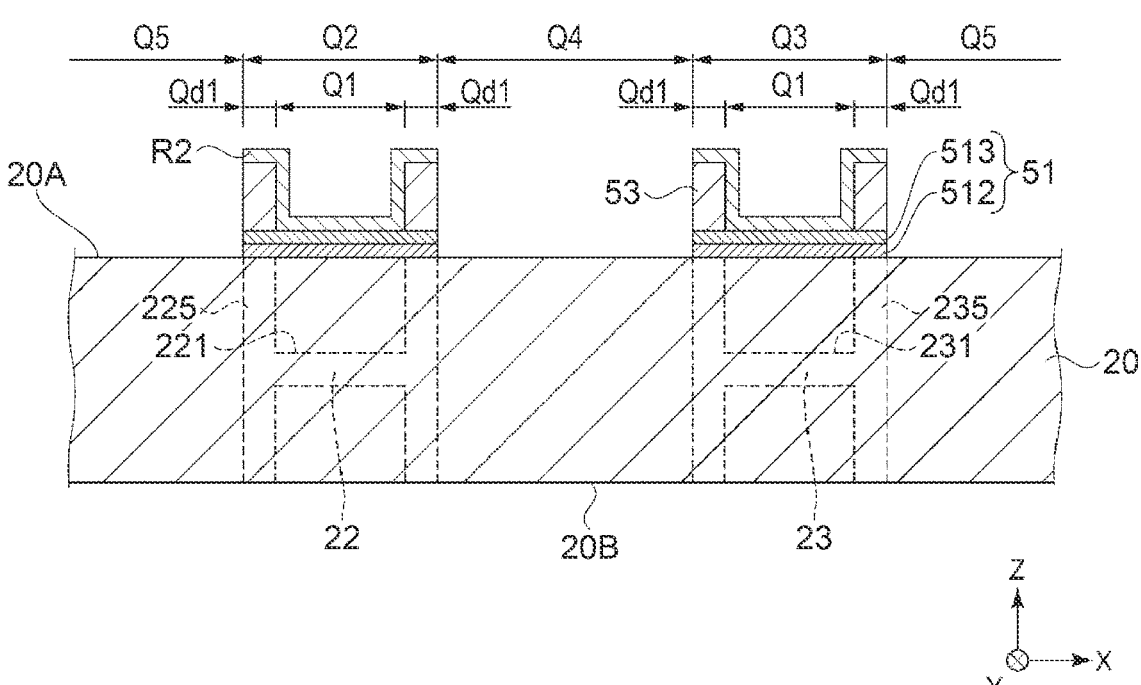
FIG. 12 is a cross-sectional view showing the method for manufacturing the vibration element.

In this manner, as shown in FIG. 12, the first base film 51 is formed in the first vibrating arm forming region Q2 and the second vibrating arm forming region Q3 which are predetermined regions of the first substrate surface 20A of the quartz crystal substrate 20.

That is, by the first base film forming step S2 including the first base film coating step S21 and the first base film patterning step S22, the first base film 51 is formed in the first vibrating arm forming region Q2 in which the first vibrating arm 22 is formed and the second vibrating arm forming region Q3 in which the second vibrating arm 23 is formed on the first substrate surface 20A of the quartz crystal substrate 20.

In addition, by the first protective film forming step S3 including the first protective film coating step S31 and the first protective film patterning step S32, the first protective film 53 is formed in the first bank portion forming regions Qd1 which are regions of the first vibrating arm forming region Q2 and the second vibrating arm forming region Q3, in which the first base film 51 is formed, excluding the first groove forming regions Q1.

In the present embodiment, the first base film coating step S21, the first base film patterning step S22, the first protective film coating step S31, and the first protective film patterning step S32 are performed in an order of the first base film coating step S21, the first protective film coating step S31, the first protective film patterning step S32, and the first base film patterning step S22. However, the order of performing the first base film coating step S21, the first base film patterning step S22, the first protective film coating step S31, and the first protective film patterning step S32 is not limited thereto. For example, the first base film coating step S21, the first base film patterning step S22, the first protective film coating step S31, and the first protective film patterning step S32 may be performed in order, or the first base film coating step S21, the first protective film coating step S31, the first base film patterning step S22, and the first protective film patterning step S32 may be performed in order.

Figure 13:
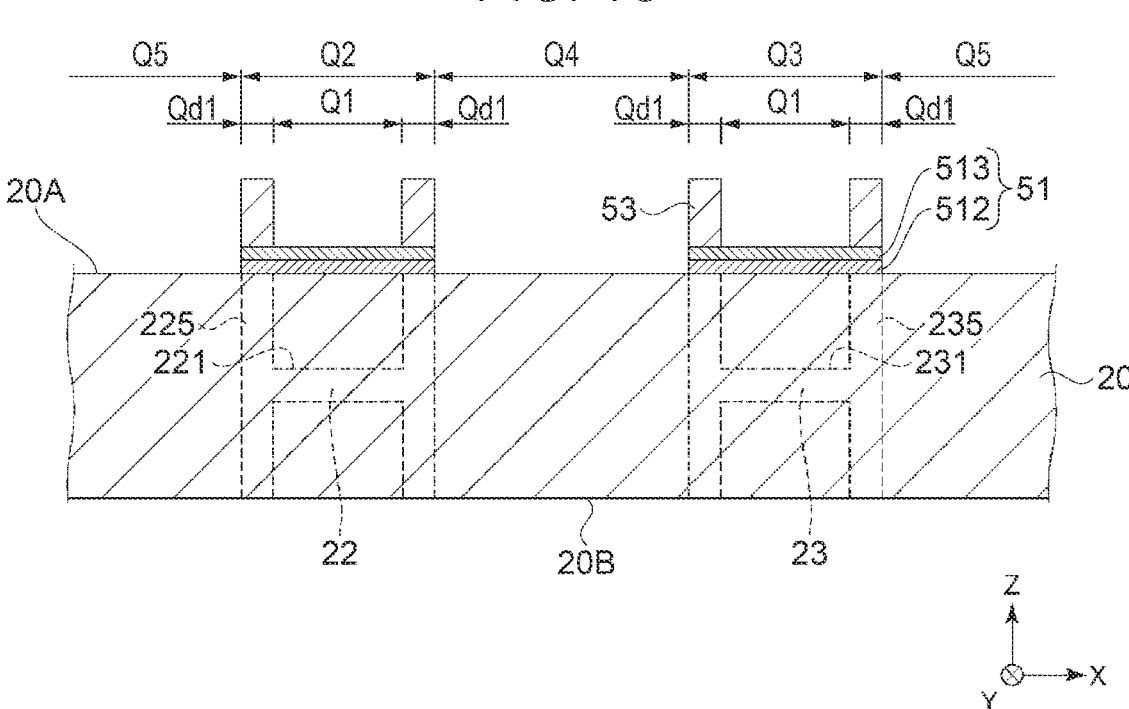
FIG. 13 is a cross-sectional view showing the method for manufacturing the vibration element.

Next, as shown in FIG. 13, the second resist film R2 is removed, and the process proceeds to the first dry-etching step S4.

First Dry-Etching Step S4

Figure 14:
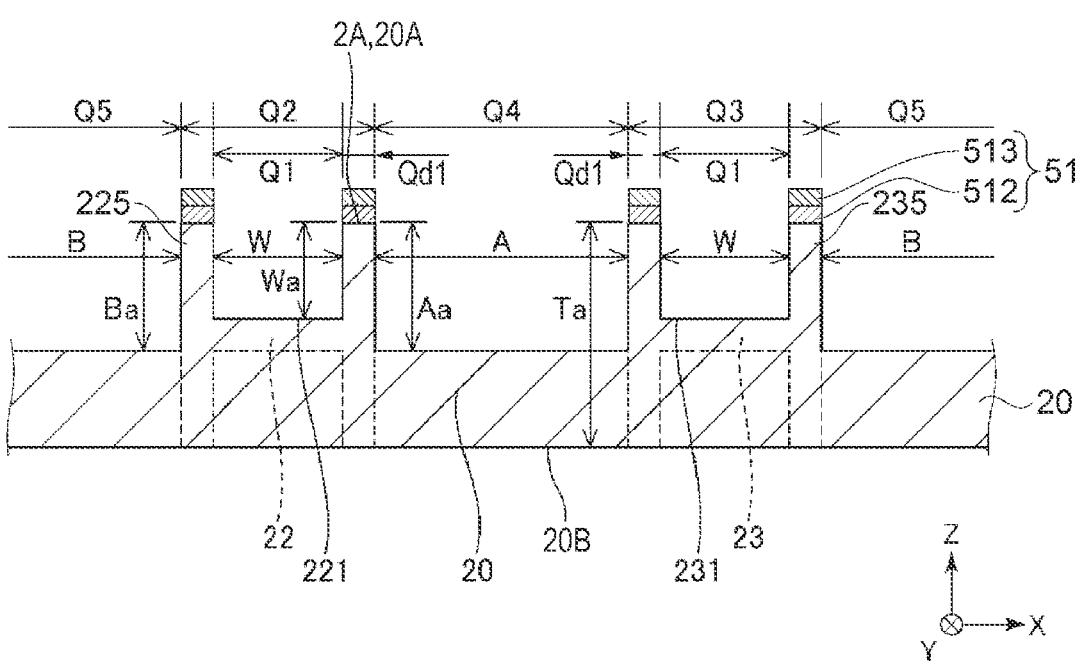
FIG. 14 is a cross-sectional view showing the method for manufacturing the vibration element.

As shown in FIG. 14, the quartz crystal substrate 20 is dry-etched from the first substrate surface 20A side through the first base film 51 and the first protective film 53, so that the first surface 2A, the first grooves 221, 231, and an outer shape of the vibration substrate 2 are simultaneously formed. Further, the "simultaneously formed" means that the first surface 2A, the first grooves 221, 231, and the outer shape of the vibration substrate 2 are collectively formed in one step. More specifically, the dry-etching in this step is reactive ion etching, and is performed using a reactive ion etching device (RIE device). A reaction gas introduced into the RIE device is not particularly limited, and for example, $SF_6$, $CF_4$, $C_2F_4$, $C_2F_6$, $C_3F_6$, $C_4F_8$ can be used.

In the first dry-etching step S4, the first base film 51 and the first protective film 53 formed on the first substrate surface 20A of the quartz crystal substrate 20 are etched at respective predetermined etching rates. Therefore, respective etching depths of the quartz crystal substrate 20 in a region where the first base film 51 and the first protective film 53 are not formed and the first substrate surface 20A is exposed, a region where the first base film 51 is formed, and a region where the first base film 51 and the first protective film 53 are formed can be controlled by the first base film 51 and the first protective film 53.

In the present embodiment, the first base film 51 and the first protective film 53 are not formed in the inter-arm region Q4 or the inter-element regions Q5 of the first substrate surface 20A of the quartz crystal substrate 20. That is, in the inter-arm region Q4 and the inter-element regions Q5, the first substrate surface 20A of the quartz crystal substrate 20 is exposed. Therefore, the first dry-etching step S4 is started, and etching performed on the quartz crystal substrate 20 is started in the inter-arm region Q4 and the inter-element regions Q5. By etching the inter-arm region Q4 and the inter-element regions Q5 of the first substrate surface 20A, the outer shape of the vibration substrate 2 is formed.

The first base film 51 is formed in the first groove forming regions Q1 of the first substrate surface 20A of the quartz crystal substrate 20. Therefore, when the first dry-etching step S4 is started, first, etching performed on the first base film 51 is started. Then, by removing the first base film 51, the first substrate surface 20A of the quartz crystal substrate 20 is exposed, and etching performed on the quartz crystal substrate 20 is started. The first groove forming regions Q1 of the first substrate surface 20A are etched to form the first grooves 221, 231. Since the start of the etching performed on the quartz crystal substrate 20 in the first groove forming regions Q1 is later than the start of the etching performed on the quartz crystal substrate 20 in the inter-arm region Q4 and the inter-element regions Q5, an etching depth of the quartz crystal substrate 20 in the first groove forming regions Q1 is smaller than an etching depth of the quartz crystal substrate 20 in the inter-arm region Q4 and the inter-element regions Q5.

The first base film 51 and the first protective film 53 are formed in the first bank portion forming regions Qd1 of the first substrate surface 20A of the quartz crystal substrate 20. Therefore, when the first dry-etching step S4 is started, first, etching performed on the first protective film 53 is started. Next, by removing the first protective film 53, etching performed on the first base film 51 is started. Then, by removing the first base film 51, the first substrate surface 20A of the quartz crystal substrate 20 is exposed, and etching performed on the quartz crystal substrate 20 is started. Therefore, the start of the etching performed on the first substrate surface 20A of the quartz crystal substrate 20 in the first bank portion forming regions Qd1 is later than that in the first groove forming regions Q1. That is, an etching depth of the quartz crystal substrate 20 in the first bank portion forming regions Qd1 is smaller than an etching depth of the quartz crystal substrate 20 in the first groove forming regions Q1.

In the present embodiment, since a thickness of the first protective film 53 is sufficiently increased, the first dry-etching step S4 is ended in a state where the first base film 51 remains in the first bank portion forming regions Qd1 of the first substrate surface 20A. That is, the first bank portion forming regions Qd1 of the first substrate surface 20A are protected by the first base film 51. Therefore, in the present embodiment, the first bank portion forming regions Qd1 of the first substrate surface 20A are not etched.

Further, in the present embodiment, the first protective film 53 is removed when the first dry-etching step S4 is ended, and the first protective film 53 may not be removed.

The first dry-etching step S4 ends when the first grooves 221, 231 have a desired depth. The etching depth of the quartz crystal substrate 20 in the first groove forming regions Q1 is a depth Wa of the first grooves 221, 231. The etching depth of the quartz crystal substrate 20 in the inter-arm region Q4 is a depth Aa of the outer shape of the vibration substrate 2. The etching depth of the quartz crystal substrate 20 in the inter-element regions Q5 is a depth Ba of the outer shape of the vibration substrate 2.

As described above, the etching depth of the quartz crystal substrate 20 in the first groove forming regions Q1 is smaller than the etching depth of the quartz crystal substrate 20 in the inter-arm region Q4 and the inter-element regions Q5. Therefore, the depths Aa, Ba of the outer shape of the vibration substrate 2 are larger than the depth Wa of the first grooves 221, 231. That is, Wa<Aa and Wa<Ba. In the present embodiment, each of the depths Aa, Ba is half or more of a thickness Ta of the quartz crystal substrate 20.

As described above, in the first base film forming step S2, the first base film 51 is formed in the first vibrating arm forming region Q2 and the second vibrating arm forming region Q3 of the first substrate surface 20A of the quartz crystal substrate 20, and further, in the first protective film forming step S3, the first protective film 53 is formed in the first bank portion forming regions Qd1 which are the regions of the first vibrating arm forming region Q2 and the second vibrating arm forming region Q3, in which the first base film 51 is formed, excluding the first groove forming regions Q1. Therefore, in the first dry-etching step S4, outer shapes of the first and second vibrating arms 22, 23 and the first grooves 221, 231 can be collectively formed without using a micro loading effect. Since dimensions of the first and second vibrating arms 22, 23, the first grooves 221, 231, and the like can be controlled by adjusting thicknesses and widths of the first base film 51 and the first protective film 53, there is no restriction on a setting of dimensions such as a width A of the inter-arm region Q4 in the X direction, a width B of the inter-element region Q5 in the X direction, and a width W of each of the first grooves 221, 231 in the X direction, and degree of freedom in design of the vibration element 1 can be improved.

In addition, since the micro loading effect is not used, restrictions on dry-etching conditions such as selection of the reaction gas used in the dry-etching are relieved, and thus the vibration element 1 can be easily manufactured as compared with a case where the micro loading effect is used.

As described above, in the present embodiment, in the first dry-etching step S4, the dry-etching is ended in a state where the first base film 51 remains on the first substrate surface 20A of the quartz crystal substrate 20 in the first bank portion forming regions Qd1. That is, the first substrate surface 20A of the quartz crystal substrate 20 in the first bank portion forming regions Qd1 is not etched in the first dry-etching step S4. The first substrate surface 20A of the quartz crystal substrate 20 in the first bank portion forming regions Qd1 becomes the first surface 2A of the first and second vibrating arms 22, 23 in the first base film removing step S5 to be described later. The "state where the first base film 51 remains" means a "state where at least a portion of the first base film 51 remains". For example, in the present embodiment, when the dry-etching is ended in the first dry-etching step S4, the first metal film 512 and the second metal film 513 constituting the first base film 51 remain on the quartz crystal substrate 20, but the second metal film 513 may be removed.

In the present embodiment, in the first dry-etching step S4, the dry-etching is ended in the state where the first base film 51 remains on the first substrate surface 20A of the quartz crystal substrate 20 in the first bank portion forming regions Qd1, but the dry-etching may be ended in a state where the first base film 51 does not remain on the first substrate surface 20A of the quartz crystal substrate 20 in the first bank portion forming regions Qd1. That is, the first substrate surface 20A of the quartz crystal substrate 20 in the first bank portion forming regions Qd1 may be etched in the first dry-etching step S4. In this case, a surface of the quartz crystal substrate 20 etched in the first dry-etching step S4 becomes the first surface 2A of the first and second vibrating arms 22, 23.

In this manner, the first surface 2A is formed by etching the first bank portion forming regions Qd1 of the first substrate surface 20A or by not etching the first bank portion forming regions Qd1.

As described above, in the present embodiment, the first base film 51 and the first protective film 53 are not formed in the inter-arm region Q4 or the inter-element regions Q5. Therefore, along with the start of the dry-etching in the first dry-etching step S4, the etching performed on the quartz crystal substrate 20 in the inter-arm region Q4 and the inter-element regions Q5 is started. Therefore, the first dry-etching step S4 can be performed in a short time.

As described above, in the present embodiment, the first base film 51 is a metal film formed of metal. In general, an etching rate of metal is lower than an etching rate of a resist material. Therefore, by using the metal film as the first base film 51, the thickness of the first base film 51 can be made smaller than that of the resist film. Accordingly, dimensional accuracy of the first and second vibrating arms 22, 23, the first grooves 221, 231, and the like formed in the first dry-etching step S4 can be improved.

As described above, in the present embodiment, the first protective film 53 is a metal film formed of metal. Therefore, by using the metal film as the first protective film 53, the thickness of the first protective film 53 can be made smaller than that of the resist film. Accordingly, the dimensional accuracy of the first and second vibrating arms 22, 23, the first grooves 221, 231, and the like formed in the first dry-etching step S4 can be further improved.

First Base Film Removing Step S5

Figure 15:
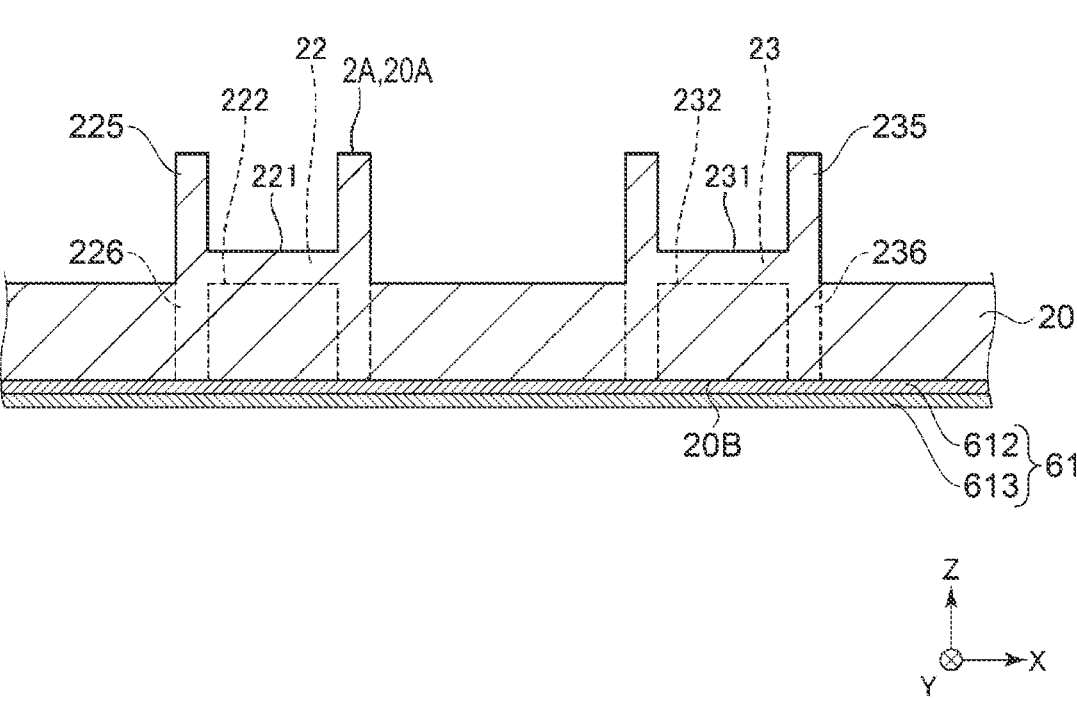
FIG. 15 is a cross-sectional view showing the method for manufacturing the vibration element.

As shown in FIG. 15, the first base film 51 remaining on the first substrate surface 20A of the quartz crystal substrate 20 in the first bank portion forming regions Qd1 is removed. As a result, the first substrate surface 20A of the quartz crystal substrate 20 becomes the first surface 2A of the first and second vibrating arms 22, 23. That is, since the first surfaces 2A of the first and second vibrating arms 22, 23 are not etched in the first dry-etching step S4, a thickness of each of the first and second vibrating arms 22, 23 and surface roughness of the first surface 2A in the first bank portion forming regions Qd1 are maintained as the thickness of the quartz crystal substrate 20 and surface roughness of the first substrate surface 20A. Therefore, thickness accuracy of the first and second vibrating arms 22, 23 is improved, and an occurrence of unnecessary vibration such as torsional vibration is prevented.

In the first dry-etching step S4 described above, when the dry-etching is ended in the state where the first base film 51 does not remain on the first substrate surface 20A of the quartz crystal substrate 20, the first base film removing step S5 may not be provided.

When the first dry-etching step S4 described above is ended and the first protective film 53 is not removed, the first base film 51 and the first protective film 53 may be collectively removed in the first base film removing step S5. Alternatively, a first protective film removing step of removing the first protective film 53 may be provided before the first base film removing step S5 is performed.

After the first base film removing step S5 is ended, the process proceeds to processing of the second substrate surface 20B of the quartz crystal substrate 20.

Second Base Film Coating Step S61

This step is performed in the same manner as the first base film coating step S21.

As shown in FIG. 15, the second substrate surface 20B of the quartz crystal substrate 20 is coated with the second base film 61. The second base film 61 is formed of a material that is etched at a predetermined etching rate in the second dry-etching step S8 to be described later.

In the present embodiment, the second base film 61 is a metal film formed of metal. Specifically, the second base film 61 is formed by stacking a third metal film 612 and a fourth metal film 613. The third metal film 612 is formed on the second substrate surface 20B of the quartz crystal substrate 20. The fourth metal film 613 is formed on a surface of the third metal film 612 on the side opposite to the quartz crystal substrate 20. The surface of the third metal film 612 on the side opposite to the quartz crystal substrate 20 is a surface of the third metal film 612 on the minus side in the Z direction. The third metal film 612 is formed of chromium (Cr). The fourth metal film 613 is formed of copper (Cu).

In the present embodiment, the second base film 61 is formed by stacking the third metal film 612 and the fourth metal film 613, but the disclosure is not limited thereto, and the second base film 61 may be formed of one film, or may be formed by stacking three or more films.

The second base film 61 may be formed of a material other than metal. For example, the second base film 61 may be a resist film formed of a resist material.

Second Protective Film Coating Step S71

This step is performed in the same manner as the first protective film coating step S31.

The second base film 61 is coated with the second protective film 63. The second protective film 63 is formed on a surface of the second base film 61 on the side opposite to the quartz crystal substrate 20. The surface of the second base film 61 on the side opposite to the quartz crystal substrate 20 is a surface of the second base film 61 on the minus side in the Z direction. The second protective film 63 is formed of a material that is etched at a predetermined etching rate in the second dry-etching step S8 to be described later.

In the present embodiment, the second protective film 63 is a metal film formed of metal. As the metal forming the second protective film 63, for example, nickel (Ni) can be used. The second protective film 63 may be formed of a material other than metal. For example, the second protective film 63 may be a resist film formed of a resist material.

Second Protective Film Patterning Step S72

This step is performed in the same manner as the first protective film patterning step S32.

First, a third resist film (not shown) is formed on a surface of the second protective film 63 on the side opposite to the quartz crystal substrate 20. The surface of the second protective film 63 on the side opposite to the quartz crystal substrate 20 is a surface of the second protective film 63 on the minus side in the Z direction. The third resist film is formed in the second bank portion forming regions Qd2 by the photolithographic technique. That is, the third resist film overlaps the second bank portion forming regions Qd2 in the plan view.

Next, the second protective film 63 is etched from a surface side of the second protective film 63 on which the third resist film is formed. The surface of the second protective film 63 on which the third resist film is formed is the surface of the second protective film 63 on the minus side in the Z direction. As a result, the second protective film 63 in the second groove forming regions Q6, the inter-arm region Q4, and the inter-element regions Q5 in which the third resist film is not formed is removed.

Figure 16:
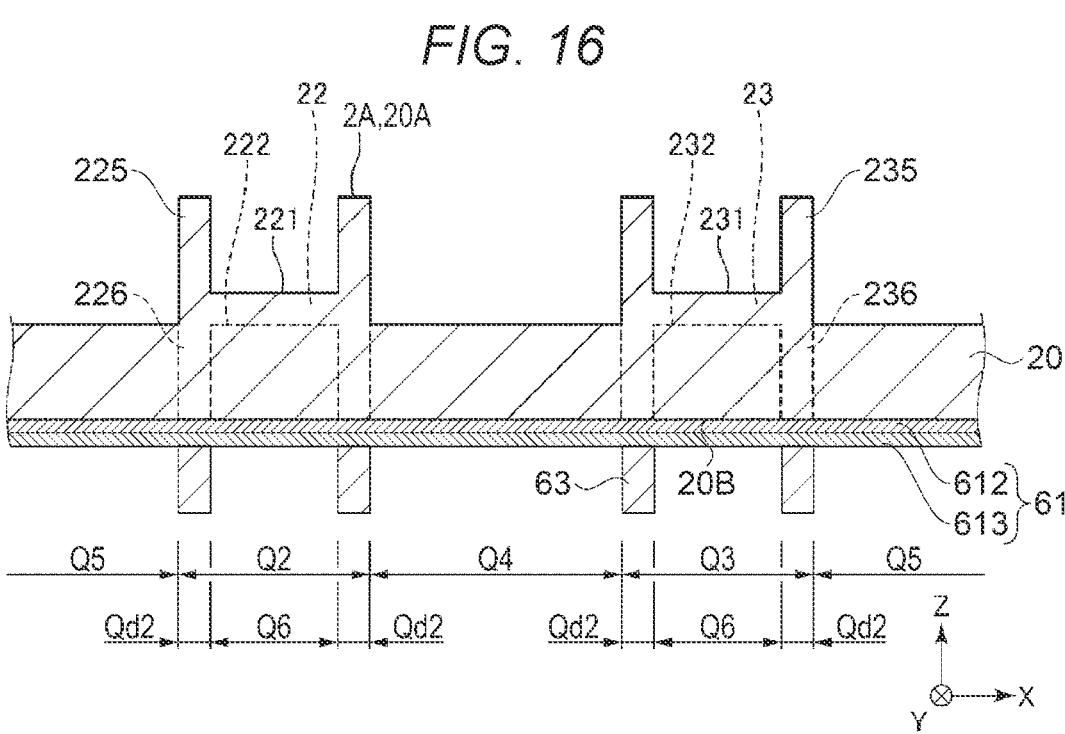
FIG. 16 is a cross-sectional view showing the method for manufacturing the vibration element.

In this manner, as shown in FIG. 16, the second protective film 63 can be formed in the second bank portion forming regions Qd2 which are the predetermined regions of the second base film 61.

Second Base Film Patterning Step S62

This step is performed in the same manner as the first base film patterning step S22.

The second base film patterning step S62 includes a step of forming a fourth resist film R4 in the first vibrating arm forming region Q2 and the second vibrating arm forming region Q3, and a step of etching the second base film 61 using the fourth resist film R4 as a mask.

Figure 17:
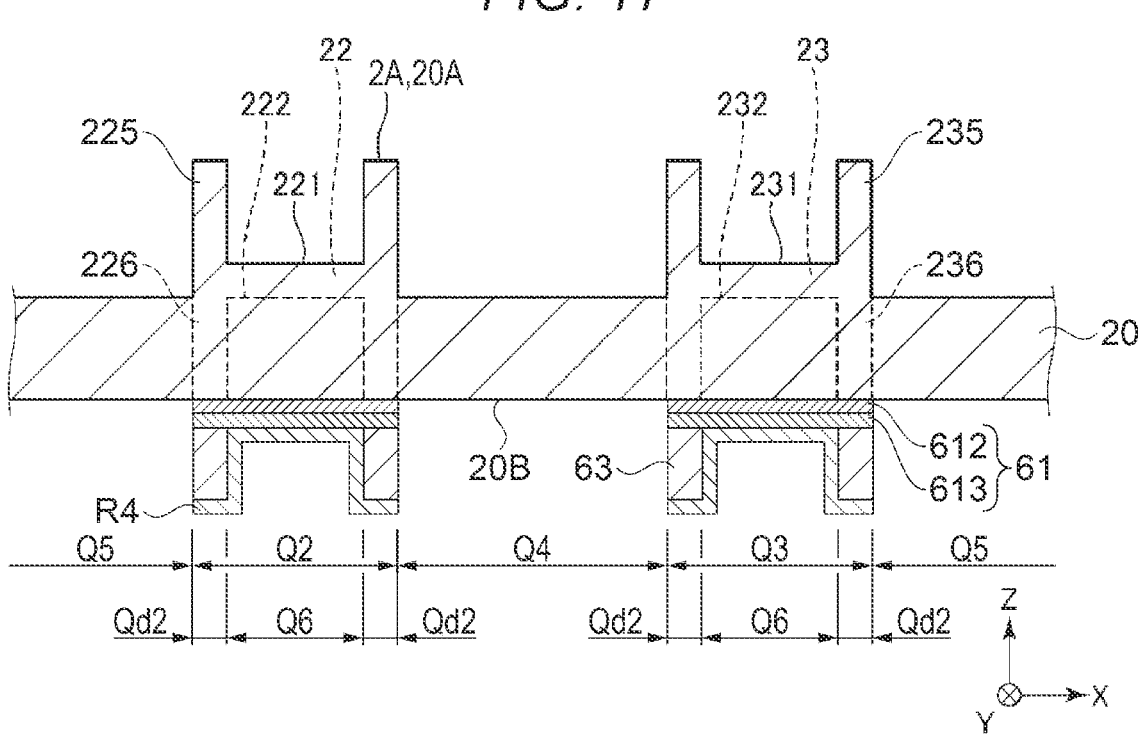
FIG. 17 is a cross-sectional view showing the method for manufacturing the vibration element.

First, as shown in FIG. 17, the fourth resist film R4 is formed in the first vibrating arm forming region Q2 and the second vibrating arm forming region Q3 of the surface of the second base film 61 on the side opposite to the quartz crystal substrate 20 by the photolithographic technique. In the second bank portion forming regions Qd2, the fourth resist film R4 is formed on the surface of the second base film 61 on the side opposite to the quartz crystal substrate 20 through the second protective film 63. Further, in the second groove forming regions Q6, the fourth resist film R4 is formed on the surface of the second base film 61 on the side opposite to the quartz crystal substrate 20 without the second protective film 63 interposed therebetween.

Next, the second base film 61 is etched from a surface side of the second base film 61 on which the fourth resist film R4 is formed. That is, the second base film 61 is etched from a surface side of the second base film 61 on the minus side in the Z direction using the fourth resist film R4 as a mask. In the present embodiment, the step of etching the second base film 61 using the fourth resist film R4 as the mask includes a step of etching the third metal film 612 of the second base film 61 and a step of etching the fourth metal film 613 of the second base film 61.

In this manner, as shown in FIG. 17, the second base film 61 in the inter-arm region Q4 and the inter-element regions Q5 where the fourth resist film R4 is not formed is removed, and the second base film 61 can be formed in the first vibrating arm forming region Q2 and the second vibrating arm forming region Q3 which are predetermined regions of the second substrate surface 20B of the quartz crystal substrate 20.

That is, by the second base film forming step S6 including the second base film coating step S61 and the second base film patterning step S62, the second base film 61 is formed in the first vibrating arm forming region Q2 in which the first vibrating arm 22 is formed and the second vibrating arm forming region Q3 in which the second vibrating arm 23 is formed on the second substrate surface 20B of the quartz crystal substrate 20.

In addition, by the second protective film forming step S7 including the second protective film coating step S71 and the second protective film patterning step S72, the second protective film 63 is formed in the second bank portion forming regions Qd2 which are regions of the first vibrating arm forming region Q2 and the second vibrating arm forming region Q3, in which the second base film 61 is formed, excluding the second groove forming regions Q6.

In the present embodiment, the second base film coating step S61, the second base film patterning step S62, the second protective film coating step S71, and the second protective film patterning step S72 are performed in an order of the second base film coating step S61, the second protective film coating step S71, the second protective film patterning step S72, and the second base film patterning step S62. However, the order of performing the second base film coating step S61, the second base film patterning step S62, the second protective film coating step S71, and the second protective film patterning step S72 is not limited thereto. For example, the second base film coating step S61, the second base film patterning step S62, the second protective film coating step S71, and the second protective film patterning step S72 may be performed in order, or the second base film coating step S61, the second protective film coating step S71, the second base film patterning step S62, and the second protective film patterning step S72 may be performed in order.

Figure 18:
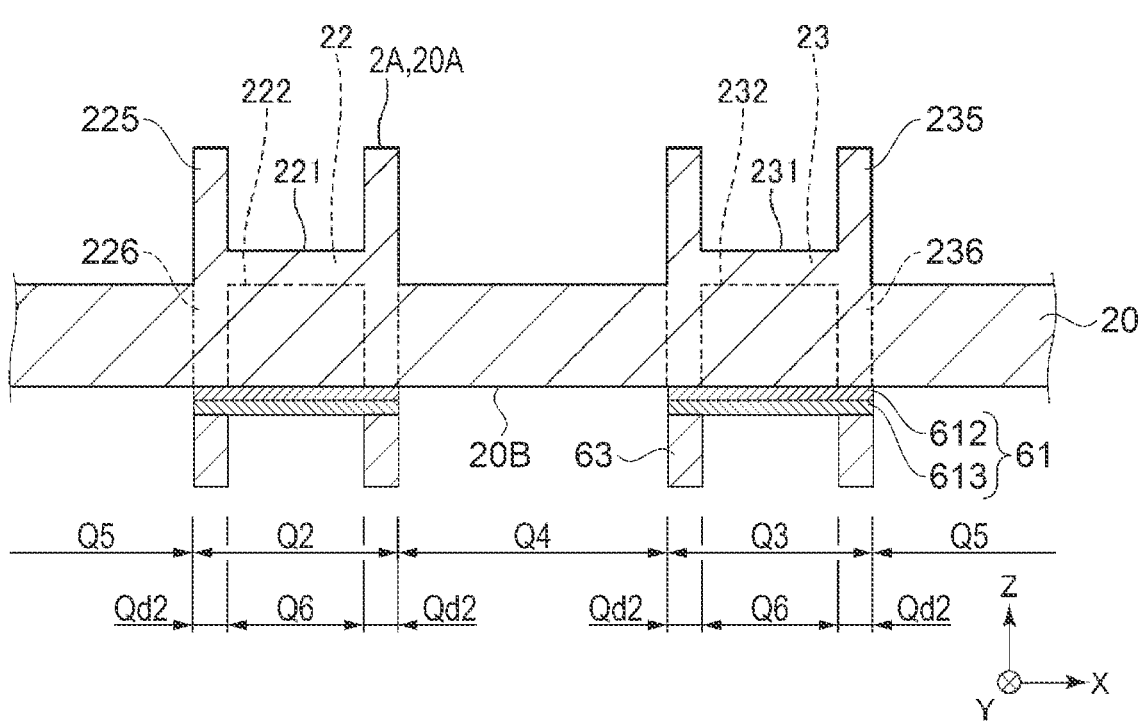
FIG. 18 is a cross-sectional view showing the method for manufacturing the vibration element.

Next, as shown in FIG. 18, the fourth resist film R4 is removed, and the process proceeds to the second dry-etching step S8.

Second Dry-Etching Step S8

This step is performed in the same manner as the first dry-etching step S4.

Figure 19:
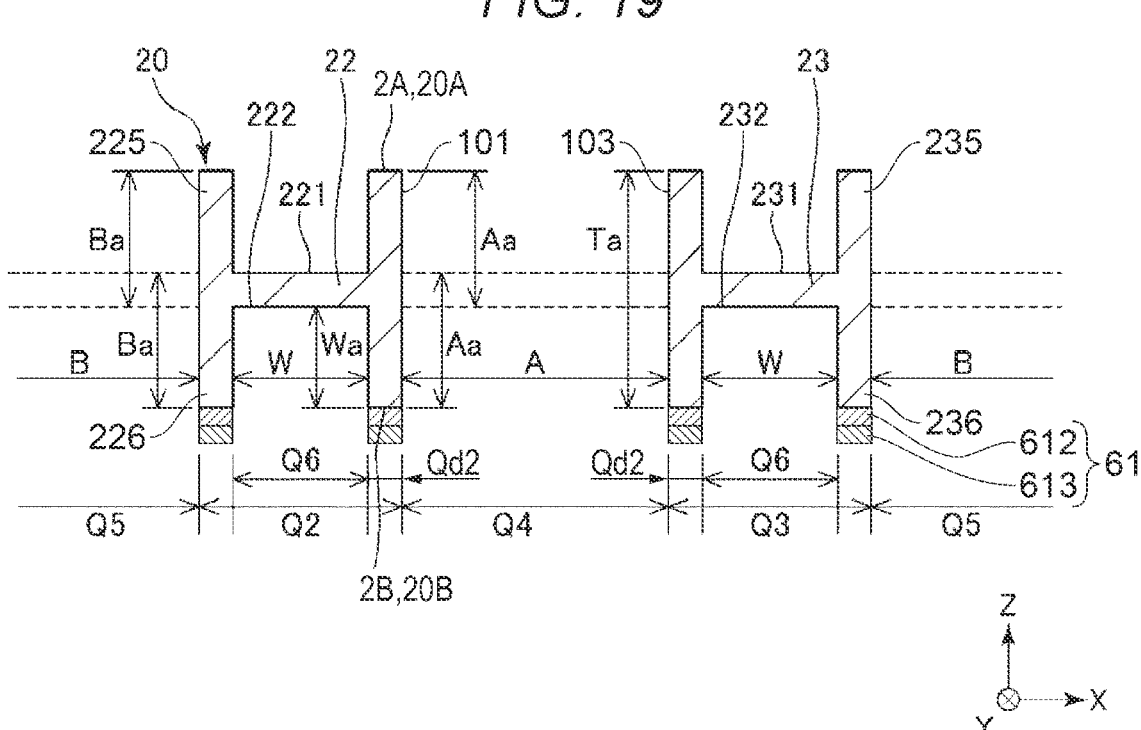
FIG. 19 is a cross-sectional view showing the method for manufacturing the vibration element.

As shown in FIG. 19, the quartz crystal substrate 20 is dry-etched from the second substrate surface 20B side through the second base film 61 and the second protective film 63, so that the second surface 2B, the second grooves 222, 232, and an outer shape of the vibration substrate 2 are simultaneously formed.

In the second dry-etching step S8, the second base film 61 and the second protective film 63 formed on the second substrate surface 20B of the quartz crystal substrate 20 are etched at respective predetermined etching rates. Therefore, respective etching depths of the quartz crystal substrate 20 in a region where the second base film 61 and the second protective film 63 are not formed and the second substrate surface 20B is exposed, a region where the second base film 61 is formed, and a region where the second base film 61 and the second protective film 63 are formed can be controlled by the second base film 61 and the second protective film 63.

In the present embodiment, the second base film 61 and the second protective film 63 are not formed in the inter-arm region Q4 or the inter-element regions Q5 of the second substrate surface 20B of the quartz crystal substrate 20. That is, in the inter-arm region Q4 and the inter-element regions Q5, the second substrate surface 20B of the quartz crystal substrate 20 is exposed. Therefore, the second dry-etching step S8 is started, and etching performed on the quartz crystal substrate 20 is started in the inter-arm region Q4 and the inter-element regions Q5. By etching the inter-arm region Q4 and the inter-element regions Q5 of the second substrate surface 20B, the outer shape of the vibration substrate 2 is formed.

The second base film 61 is formed in the second groove forming regions Q6 of the second substrate surface 20B of the quartz crystal substrate 20. Therefore, the etching performed on the quartz crystal substrate 20 is started after the second base film 61 is removed. The second groove forming regions Q6 of the second substrate surface 20B are etched to form the second grooves 222, 232. Since the start of the etching performed on the quartz crystal substrate 20 in the second groove forming regions Q6 is later than the start of the etching performed on the quartz crystal substrate 20 in the inter-arm region Q4 and the inter-element regions Q5, an etching depth of the quartz crystal substrate 20 in the second groove forming regions Q6 is smaller than an etching depth of the quartz crystal substrate 20 in the inter-arm region Q4 and the inter-element regions Q5.

The second base film 61 and the second protective film 63 are formed in the second bank portion forming regions Qd2 of the second substrate surface 20B of the quartz crystal substrate 20. Therefore, the start of the etching performed on the second substrate surface 20B of the quartz crystal substrate 20 in the second bank portion forming regions Qd2 is later than that in the second groove forming regions Q6. That is, an etching depth of the quartz crystal substrate 20 in the second bank portion forming regions Qd2 is smaller than an etching depth of the quartz crystal substrate 20 in the second groove forming regions Q6.

In the present embodiment, since a thickness of the second protective film 63 is sufficiently increased, the second dry-etching step S8 is ended in a state where the second base film 61 remains in the second bank portion forming regions Qd2 of the second substrate surface 20B. That is, the second bank portion forming regions Qd2 of the second substrate surface 20B are protected by the second base film 61. Therefore, the second bank portion forming regions Qd2 of the second substrate surface 20B are not etched.

Further, in the present embodiment, the second protective film 63 is removed when the second dry-etching step S8 is ended, and the second protective film 63 may not be removed.

The second dry-etching step S8 ends when the second grooves 222, 232 have a desired depth. The etching depth of the quartz crystal substrate 20 in the second groove forming regions Q6 is the depth Wa of the second grooves 222, 232. The etching depth of the quartz crystal substrate 20 in the inter-arm region Q4 is the depth Aa of the outer shape of the vibration substrate 2. The etching depth of the quartz crystal substrate 20 in the inter-element regions Q5 is the depth Ba of the outer shape of the vibration substrate 2.

As described above, the etching depth of the quartz crystal substrate 20 in the second groove forming regions Q6 is smaller than the etching depth of the quartz crystal substrate 20 in the inter-arm region Q4 and the inter-element regions Q5. Therefore, the depths Aa, Ba of the outer shape of the vibration substrate 2 are larger than the depth Wa of the second grooves 222, 232. That is, Wa<Aa and Wa<Ba. In the present embodiment, each of the depths Aa, Ba is half or more of the thickness Ta of the quartz crystal substrate 20. By setting the depths Aa, Ba to half or more of the thickness Ta of the quartz crystal substrate 20, the inter-arm region Q4 and the inter-element regions Q5 are penetrated in the second dry-etching step S8. The first vibrating arm 22 and the second vibrating arm 23 are formed by the inter-arm region Q4 and the inter-element regions Q5 being penetrated.

As described above, in the second base film forming step S6, the second base film 61 is formed in the first vibrating arm forming region Q2 and the second vibrating arm forming region Q3, and further, in the second protective film forming step S7, the second protective film 63 is formed in the second bank portion forming regions Qd2 which are the regions of the first vibrating arm forming region Q2 and the second vibrating arm forming region Q3, in which the second base film 61 is formed, excluding the second groove forming regions Q6. Therefore, in the second dry-etching step S8, the outer shapes of the first and second vibrating arms 22, 23 and the second grooves 222, 232 can be collectively formed without using the micro loading effect. Since dimensions of the first and second vibrating arms 22, 23, the second grooves 222, 232, and the like can be controlled by adjusting thicknesses and widths of the second base film 61 and the second protective film 63, there is no restriction on the setting of dimensions such as the width A of the inter-arm region Q4 in the X direction, the width B of the inter-element region Q5 in the X direction, and the width W of each of the second grooves 222, 232 in the X direction, and the degree of freedom in design of the vibration element 1 can be improved.

In addition, since the micro loading effect is not used, restrictions on the dry-etching conditions such as the selection of the reaction gas used in the dry-etching are relieved, and thus the vibration element 1 can be easily manufactured as compared with the case where the micro loading effect is used.

As described above, in the present embodiment, in the second dry-etching step S8, the dry-etching is ended in a state where the second base film 61 remains on the second substrate surface 20B of the quartz crystal substrate 20 in the second bank portion forming regions Qd2. That is, the second substrate surface 20B of the quartz crystal substrate 20 in the second bank portion forming regions Qd2 is not etched in the second dry-etching step S8. The second substrate surface 20B of the quartz crystal substrate 20 in the second bank portion forming regions Qd2 becomes the second surface 2B of the first and second vibrating arms 22, 23 in the second base film removing step S9 to be described later. The "state where the second base film 61 remains" means a "state where at least a portion of the second base film 61 remains". For example, in the present embodiment, when the dry-etching is ended in the second dry-etching step S8, the third metal film 612 and the fourth metal film 613 constituting the second base film 61 remain on the quartz crystal substrate 20, but the fourth metal film 613 may be removed.

In the present embodiment, in the second dry-etching step S8, the dry-etching is ended in the state where the second base film 61 remains on the second substrate surface 20B of the quartz crystal substrate 20 in the second bank portion forming regions Qd2, but the dry-etching may be ended in a state where the second base film 61 does not remain on the second substrate surface 20B of the quartz crystal substrate 20 in the second bank portion forming regions Qd2. That is, the second substrate surface 20B of the quartz crystal substrate 20 in the second bank portion forming regions Qd2 may be etched in the second dry-etching step S8. In this case, a surface of the quartz crystal substrate 20 etched in the second dry-etching step S8 becomes the second surface 2B of the first and second vibrating arms 22, 23.

In this manner, the second surface 2B is formed by etching the second bank portion forming regions Qd2 of the second substrate surface 20B or by not etching the second bank portion forming regions Qd2.

As described above, in the present embodiment, the second base film 61 and the second protective film 63 are not formed in the inter-arm region Q4 or the inter-element regions Q5. Therefore, along with the start of the dry-etching in the second dry-etching step S8, the etching performed on the quartz crystal substrate 20 in the inter-arm region Q4 and the inter-element regions Q5 is started. Therefore, the second dry-etching step S8 can be performed in a short time.

As described above, in the present embodiment, the second base film 61 is a metal film formed of metal. Therefore, by using the metal film as the second base film 61, the thickness of the second base film 61 can be made smaller than that of the resist film. Accordingly, dimensional accuracy of the first and second vibrating arms 22, 23, the second grooves 222, 232, and the like formed in the second dry-etching step S8 can be improved.

As described above, in the present embodiment, the second protective film 63 is a metal film formed of metal. Therefore, by using the metal film as the second protective film 63, the thickness of the second protective film 63 can be made smaller than that of the resist film. Accordingly, the dimensional accuracy of the first and second vibrating arms 22, 23, the second grooves 222, 232, and the like formed in the second dry-etching step S8 can be further improved.

In the present embodiment, the first base film 51 and the second base film 61 are metal films, but at least one of the first base film 51 and the second base film 61 may be a metal film. For example, one of the first base film 51 and the second base film 61 may be a metal film, and the other one of the first base film 51 and the second base film 61 may be a resist film.

In addition, in the present embodiment, the first protective film 53 and the second protective film 63 are metal films, but at least one of the first protective film 53 and the second protective film 63 may be a metal film. For example, one of the first protective film 53 and the second protective film 63 may be a metal film, and the other one of the first protective film 53 and the second protective film 63 may be a resist film.

Second Base Film Removing Step S9

This step is performed in the same manner as the first base film removing step S5.

Figure 20:
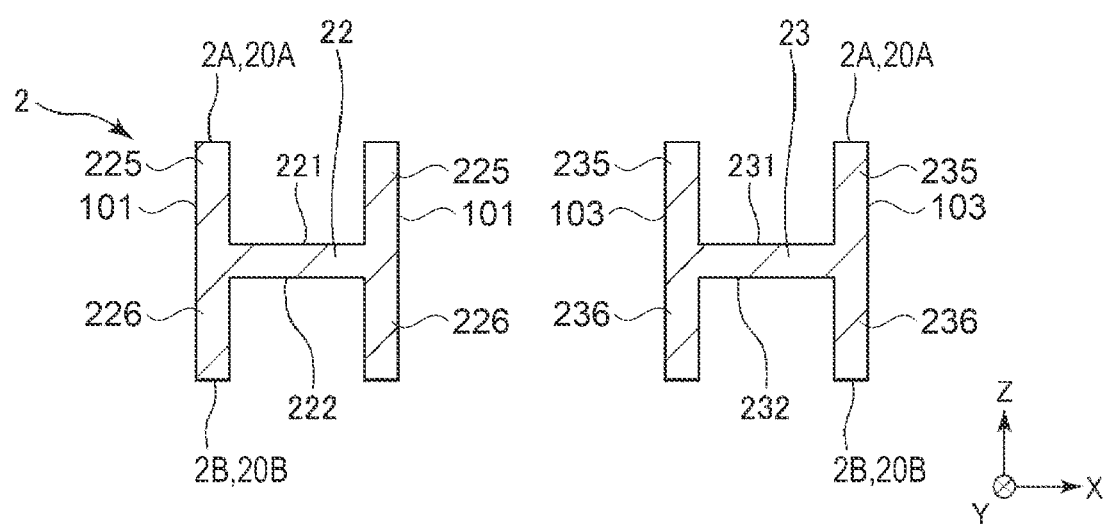
FIG. 20 is a cross-sectional view showing the method for manufacturing the vibration element.

As shown in FIG. 20, the second base film 61 remaining on the second substrate surface 20B of the quartz crystal substrate 20 in the second bank portion forming regions Qd2 is removed. As a result, the second substrate surface 20B of the quartz crystal substrate 20 becomes the second surface 2B of the first and second vibrating arms 22, 23. That is, since the second surfaces 2B of the first and second vibrating arms 22, 23 are not etched in the second dry-etching step S8, the thickness of each of the first and second vibrating arms 22, 23 and surface roughness of the second surface 2B in the second bank portion forming regions Qd2 are maintained as the thickness of the quartz crystal substrate 20 and surface roughness of the second substrate surface 20B. Therefore, the thickness accuracy of the first and second vibrating arms 22, 23 is improved, and the occurrence of the unnecessary vibration such as the torsional vibration is prevented.

In the second dry-etching step S8 described above, when the dry-etching is ended in the state where the second base film 61 does not remain on the second substrate surface 20B of the quartz crystal substrate 20, the second base film removing step S9 may not be provided.

When the second dry-etching step S8 described above is ended and the second protective film 63 is not removed, the second base film 61 and the second protective film 63 may be collectively removed in the second base film removing step S9. Alternatively, a second protective film removing step of removing the second protective film 63 may be provided before the second base film removing step S9 is performed.

In addition, in the present embodiment, the first base film 51 remaining on the first substrate surface 20A of the quartz crystal substrate 20 is removed in the first base film removing step S5, and the second base film 61 remaining on the second substrate surface 20B of the quartz crystal substrate 20 is removed in the second base film removing step S9. However, in the second base film removing step S9, the first base film 51 remaining on the first substrate surface 20A of the quartz crystal substrate 20 and the second base film 61 remaining on the second substrate surface 20B of the quartz crystal substrate 20 may be collectively removed without providing the first base film removing step S5.

By the above steps S1 to S9, as shown in FIG. 20, a plurality of vibration substrates 2 are collectively formed from the quartz crystal substrate 20.

Electrode Forming Step S10

A metal film is formed on a front surface of the vibration substrate 2 and is patterned to form the electrode 3.

As described above, the vibration element 1 is obtained.

As described above, according to the dry-etching, the processing can be performed without being affected by crystal planes of quartz crystal, and thus high dimensional accuracy can be achieved. The first grooves 221, 231 and the second grooves 222, 232 and the outer shape of the vibration substrate 2 are collectively formed, so that steps for manufacturing the vibration element 1 can be reduced and a cost of the vibration element 1 can be reduced. Displacement of the first grooves 221, 231 and the second grooves 222, 232 with respect to the outer shape is prevented, and forming accuracy of the vibration substrate 2 is improved.

The method for manufacturing the vibration element 1 is described above. However, the present disclosure is not limited thereto. A configuration of each part can be replaced with any configuration having the same function. In addition, any other constituents may be added to the present disclosure.

As described above, according to the present embodiment, following effects can be obtained.

The method for manufacturing the vibration element 1 is provided. The vibration element 1 includes: the first vibrating arm 22 and the second vibrating arm 23 extending along the Y direction as the first direction and arranged side by side along the X direction as the second direction intersecting the Y direction. The first vibrating arm 22 and the second vibrating arm 23 each have the first surface 2A and the second surface 2B arranged side by side in the Z direction as the third direction intersecting the Y direction and the X direction in the front and back relationship, and respectively have the bottomed first grooves 221, 231 opening to the first surface 2A and the bottomed second grooves 222, 232 opening to the second surface 2B. The method for manufacturing the vibration element 1 includes: the preparing step S1 of preparing the quartz crystal substrate 20 having the first substrate surface 20A and the second substrate surface 20B in the front and back relationship; the first base film forming step S2 of forming the first base film 51 on the first substrate surface 20A in the first vibrating arm forming region Q2 in which the first vibrating arm 22 is to be formed and the second vibrating arm forming region Q3 in which the second vibrating arm 23 is to be formed; the first protective film forming step S3 of forming the first protective film 53 in the first bank portion forming regions Qd1 which are the regions of the first base film 51 excluding the first groove forming regions Q1 in which the first grooves 221, 231 are to be formed; the first dry-etching step S4 of dry-etching the quartz crystal substrate 20 from the first substrate surface 20A side through the first base film 51 and the first protective film 53 to form the first surface 2A, the first grooves 221, 231, and the outer shapes of the first vibrating arm 22 and the second vibrating arm 23; the second base film forming step S6 of forming the second base film 61 in the first vibrating arm forming region Q2 and the second vibrating arm forming region Q3 of the second substrate surface 20B; the second protective film forming step S7 of forming the second protective film 63 in the second bank portion forming regions Qd2 which are the regions of the second base film 61 excluding the second groove forming regions Q6 in which the second grooves 222, 232 are to be formed; and the second dry-etching step S8 of dry-etching the quartz crystal substrate 20 from the second substrate surface 20B side through the second base film 61 and the second protective film 63 to form the second surface 2B, the second grooves 222, 232, and the outer shapes of the first vibrating arm 22 and the second vibrating arm 23.

As a result, the outer shapes of the first and second vibrating arms 22, 23, and the first grooves 221, 231 and the second grooves 222, 232 can be collectively formed, and there is no restriction on the setting of dimensions such as the width A of the inter-arm region Q4 in the X direction, the width B of the inter-element region Q5 in the X direction, the width W of each of the first grooves 221, 231 in the X direction, and the width W of each of the second grooves 222, 232 in the X direction, so that it is possible to provide a method for manufacturing the vibration element 1 having high degree of freedom in design.

2. Second Embodiment

A method for manufacturing the vibration element 1 according to a second embodiment will be described with reference to FIGS. 21 and 22. The same components as those of the first embodiment are denoted by the same reference numerals, and redundant description thereof will be omitted.

The second embodiment is the same as the first embodiment except that the first protective film forming step S3 includes a step of forming the second resist film R2 in the first base film patterning step S22, that the second resist film R2 is used as a third protective film 55 without removing the second resist film R2 in the first base film patterning step S22, that the second protective film forming step S7 includes a step of forming the fourth resist film R4 in the second base film patterning step S62, and that the fourth resist film R4 is used as a fourth protective film 65 without removing the fourth resist film R4 in the second base film patterning step S62.

In other words, the second embodiment is the same as the first embodiment except that the dry-etching in the first dry-etching step S4 is started in a state where the second resist film R2 is formed, and that the dry-etching in the second dry-etching step S8 is started in a state where the fourth resist film R4 is formed.

The preparing step S1, the first base film coating step S21, the first protective film coating step S31, and the first protective film patterning step S32 are the same as those in the first embodiment, and thus the description thereof is omitted, and the method will be described from the first base film patterning step S22.

First Base Film Patterning Step S22

Figure 21:
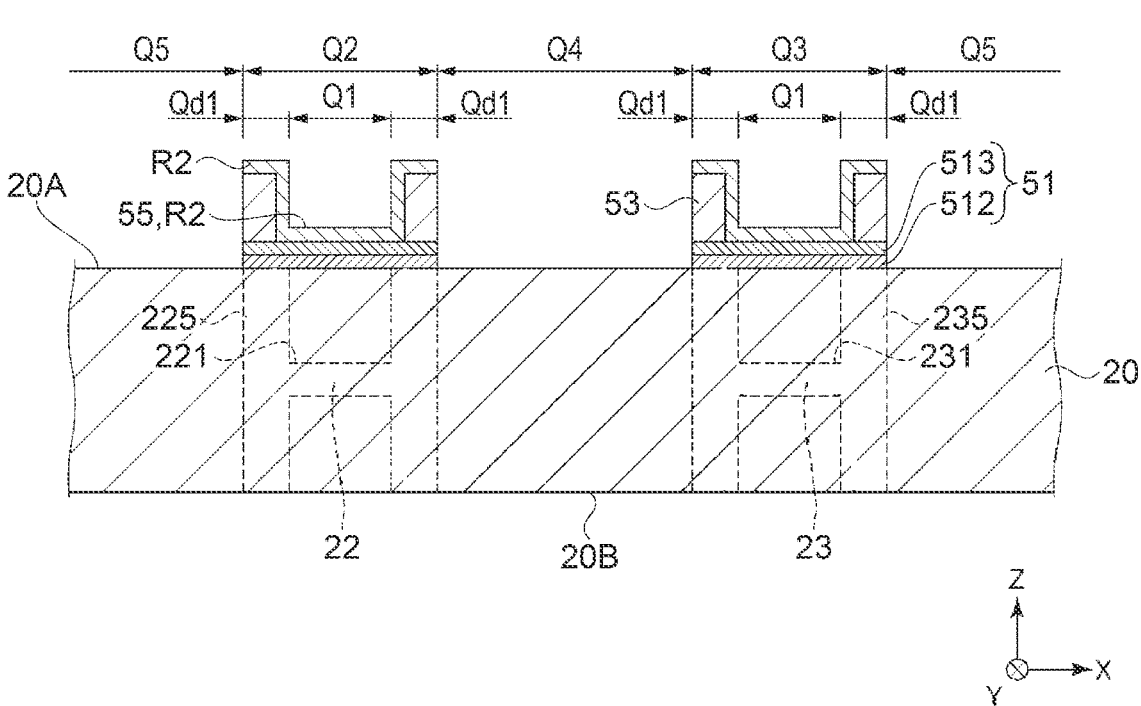
FIG. 21 is a cross-sectional view showing a method for manufacturing a vibration element according to a second embodiment.

First, as shown in FIG. 21, the second resist film R2 is formed in the first vibrating arm forming region Q2 and the second vibrating arm forming region Q3 of the surface of the first base film 51 on the side opposite to the quartz crystal substrate 20 by the photolithographic technique.

In the present embodiment, the step of forming the second resist film R2 in the first base film patterning step S22 is included in the first protective film forming step S3.

In the present embodiment, the second resist film R2 is formed of a resist material that is etched at a predetermined etching rate in the first dry-etching step S4. The second resist film R2 is formed thinner than the first protective film 53. The second resist film R2 formed in the first groove forming regions Q1 of the first vibrating arm forming region Q2 and the second vibrating arm forming region Q3 corresponds to the third protective film 55. In other words, in the first protective film forming step S3, the second resist film R2 as the third protective film 55 thinner than the first protective film 53 is formed in the first groove forming regions Q1 of the first base film 51.

Next, the first base film 51 is etched from a surface side of the first base film 51 on which the second resist film R2 is formed. As a result, the first base film 51 is formed in the first vibrating arm forming region Q2 and the second vibrating arm forming region Q3 on the first substrate surface 20A of the quartz crystal substrate 20.

Next, the second resist film R2 is not removed, and the process proceeds to the first dry-etching step S4.

First Dry-Etching Step S4

As shown in FIG. 21, in the first dry-etching step S4, the dry-etching is started in the state where the second resist film R2 is formed. Other than this, the first dry-etching step S4 is the same as that of the first embodiment.

The second resist film R2 is etched in the same manner as the first base film 51 and the first protective film 53 in the first dry-etching step S4. Therefore, even when the second resist film R2 as the third protective film 55 is formed in the first groove forming regions Q1, the outer shapes of the first and second vibrating arms 22, 23 and the first grooves 221, 231 can be collectively formed in the first dry-etching step S4 as shown in FIG. 22.

Even when the second resist film R2 is formed in the first vibrating arm forming region Q2 and the second vibrating arm forming region Q3, the outer shapes of the first and second vibrating arms 22, 23 and the first grooves 221, 231 can be collectively formed in the first dry-etching step S4, and thus a step of removing the second resist film R2 is not necessary. That is, steps for manufacturing the vibration substrate 2 can be reduced.

When the first dry-etching step S4 is ended, the process proceeds to the first base film removing step S5.

Figure 22:
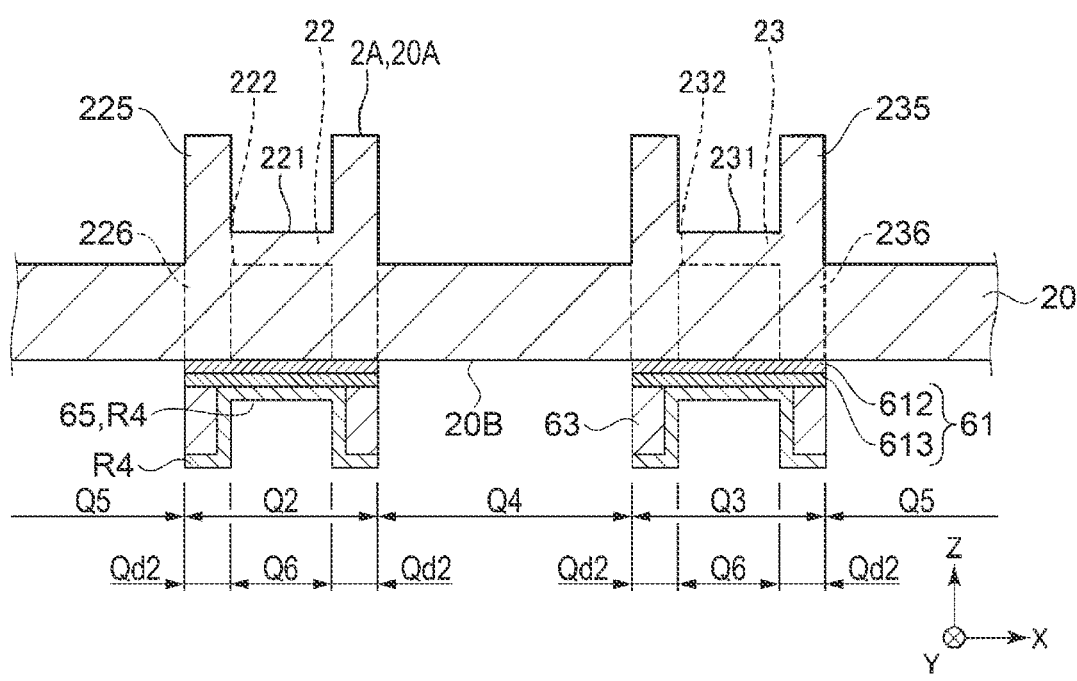
FIG. 22 is a cross-sectional view showing the method for manufacturing the vibration element.

In the present embodiment, the first dry-etching step S4 is ended in the state where the first base film 51 remains on the first substrate surface 20A of the quartz crystal substrate 20 in the first bank portion forming regions Qd1, but the first base film 51 remaining on the first substrate surface 20A of the quartz crystal substrate 20 is removed in the first base film removing step S5 and is not shown in FIG. 22.

The first base film removing step S5, the second base film coating step S61, the second protective film coating step S71, and the second protective film patterning step S72 are the same as those in the first embodiment, and thus the description thereof is omitted, and the method will be described from the second base film patterning step S62.

Second Base Film Patterning Step S62

First, as shown in FIG. 22, the fourth resist film R4 is formed in the first vibrating arm forming region Q2 and the second vibrating arm forming region Q3 of the surface of the second base film 61 on the side opposite to the quartz crystal substrate 20 by the photolithographic technique.

In the present embodiment, the step of forming the fourth resist film R4 in the second base film patterning step S62 is included in the second protective film forming step S7.

In the present embodiment, the fourth resist film R4 is formed of a resist material that is etched at a predetermined etching rate in the second dry-etching step S8. The fourth resist film R4 is formed thinner than the second protective film 63. The fourth resist film R4 formed in the second groove forming regions Q6 of the first vibrating arm forming region Q2 and the second vibrating arm forming region Q3 corresponds to the fourth protective film 65. In other words, in the second protective film forming step S7, the fourth resist film R4 as the fourth protective film 65 thinner than the second protective film 63 is formed in the second groove forming regions Q6 of the second base film 61.

Next, the second base film 61 is etched from a surface side of the second base film 61 on which the fourth resist film R4 is formed. As a result, the second base film 61 is formed in the first vibrating arm forming region Q2 and the second vibrating arm forming region Q3 on the second substrate surface 20B of the quartz crystal substrate 20.

Next, the fourth resist film R4 is not removed, and the process proceeds to the second dry-etching step S8.
Second Dry-Etching Step S8

As shown in FIG. 22, in the second dry-etching step S8, the dry-etching is started in the state where the fourth resist film R4 is formed. Other than this, the second dry-etching step S8 is the same as that of the first embodiment.

The fourth resist film R4 is etched in the same manner as the second base film 61 and the second protective film 63 in the second dry-etching step S8. Therefore, even when the fourth resist film R4 as the fourth protective film 65 is formed in the second groove forming regions Q6, the outer shapes of the first and second vibrating arms 22, 23 and the second grooves 222, 232 can be collectively formed in the second dry-etching step S8.

Even in the state where the fourth resist film R4 is formed in the first vibrating arm forming region Q2 and the second vibrating arm forming region Q3, the outer shapes of the first and second vibrating arms 22, 23 and the second grooves 222, 232 can be collectively formed in the second dry-etching step S8, and thus a step of removing the fourth resist film R4 is not necessary. That is, the steps for manufacturing the vibration substrate 2 can be reduced.

When the second dry-etching step S8 is ended, the process proceeds to the second base film removing step S9.

By the above steps S1 to S9, as shown in FIG. 20, a plurality of vibration substrates 2 are collectively formed from the quartz crystal substrate 20.

Since the second base film removing step S9 and the electrode forming step S10 are the same as those of the first embodiment, the description thereof will be omitted.

In the present embodiment, the second resist film R2 as the third protective film 55 is formed in the first protective film forming step S3, but the third protective film 55 may not be formed. In addition, the fourth resist film R4 as the fourth protective film 65 is formed in the second protective film forming step S7, but the fourth protective film 65 may not be formed. That is, at least one of the third protective film 55 and the fourth protective film 65 may be formed in the first protective film forming step S3 and the second protective film forming step S7. In other words, at least one of the second resist film R2 and the fourth resist film R4 may be removed in the first base film patterning step S22 and the second base film patterning step S62.

According to the present embodiment, following effects can be obtained in addition to the effects of the first embodiment.

Even when the second resist film R2 as the third protective film 55 is formed in the first groove forming regions Q1, the outer shapes of the first and second vibrating arms 22, 23 and the first grooves 221, 231 can be collectively formed in the first dry-etching step S4. In addition, even when the fourth resist film R4 as the fourth protective film 65 is formed in the second groove forming regions Q6, the outer shapes of the first and second vibrating arms 22, 23 and the second grooves 222, 232 can be collectively formed in the second dry-etching step S8. In addition, the steps of removing the second resist film R2 and the fourth resist film R4 are not necessary, so that the steps for manufacturing the vibration substrate 2 can be reduced.

3. Third Embodiment

A method for manufacturing the vibration element 1 according to a third embodiment will be described with reference to FIGS. 23, 24, and 25. The same components as those of the first embodiment are denoted by the same reference numerals, and redundant description thereof will be omitted.

The third embodiment is the same as the first embodiment except that in the first base film patterning step S22, the second metal film 513 is removed from the first base film 51 formed in the inter-arm region Q4 and the inter-element regions Q5, and the remaining first metal film 512 is used as a third base film 57, and that in the second base film patterning step S62, the fourth metal film 613 is removed from the second base film 61 formed in the inter-arm region Q4 and the inter-element regions Q5, and the remaining third metal film 612 is used as a fourth base film 67.

In other words, the third embodiment is the same as the first embodiment except that the dry-etching in the first dry-etching step S4 is started in a state where the first metal film 512 as the third base film 57 is formed in the inter-arm region Q4 and the inter-element regions Q5, and that the dry-etching in the second dry-etching step S8 is started in a state where the third metal film 612 as the fourth base film 67 is formed in the inter-arm region Q4 and the inter-element regions Q5.

The preparing step S1, the first base film coating step S21, the first protective film coating step S31, and the first protective film patterning step S32 are the same as those in the first embodiment, and thus the description thereof is omitted, and the method will be described from the first base film patterning step S22.
First Base Film Patterning Step S22

Figure 23:
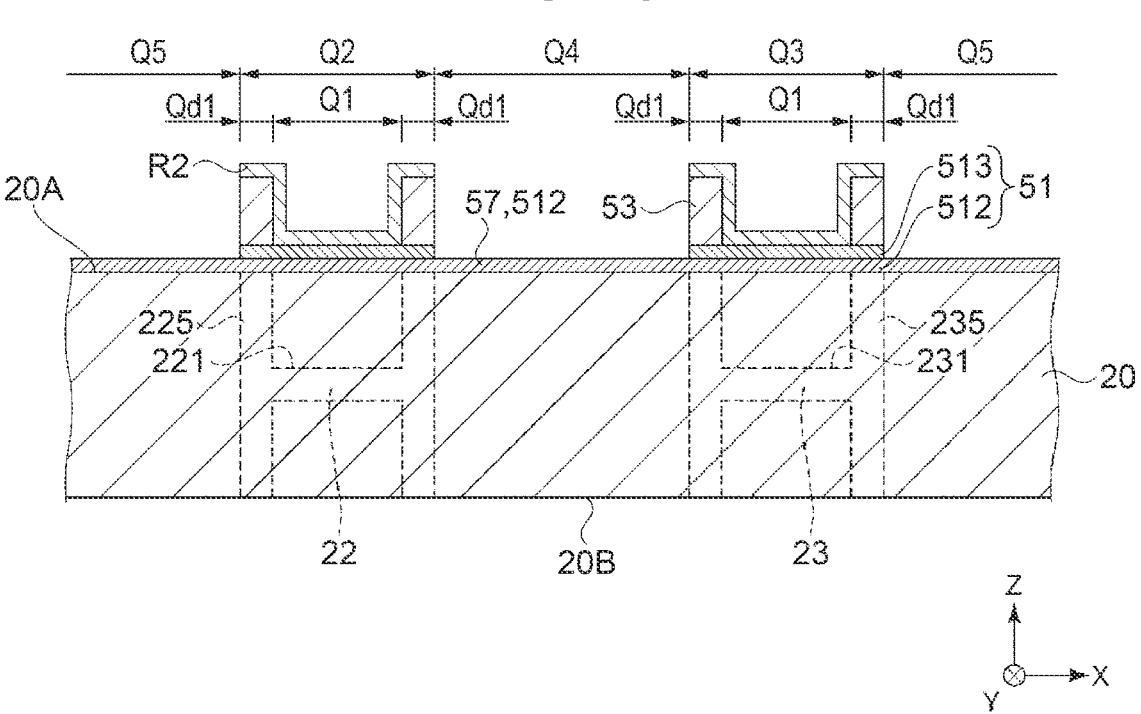
FIG. 23 is a cross-sectional view showing a method for manufacturing a vibration element according to a third embodiment.

First, as shown in FIG. 23, the second resist film R2 is formed in the first vibrating arm forming region Q2 and the second vibrating arm forming region Q3 of the surface of the first base film 51 on the side opposite to the quartz crystal substrate 20 by the photolithographic technique.

Next, the second metal film 513 of the first base film 51 is etched from the surface side of the first base film 51 on which the second resist film R2 is formed. As a result, the second metal film 513 in the inter-arm region Q4 and the inter-element regions Q5 where the second resist film R2 is not formed is removed. In addition, the first base film 51 is formed in the first vibrating arm forming region Q2 and the second vibrating arm forming region Q3 on the first substrate surface 20A of the quartz crystal substrate 20.

In the inter-arm region Q4 and the inter-element regions Q5, the second metal film 513 of the first base film 51 is removed, but the first metal film 512 is not removed. That is, the first metal film 512 is formed in the inter-arm region Q4 and the inter-element regions Q5 of the first substrate surface 20A of the quartz crystal substrate 20. The first metal film 512 formed in the inter-arm region Q4 and the inter-element regions Q5 of the first substrate surface 20A of the quartz crystal substrate 20 corresponds to the third base film 57. In other words, in the first base film forming step S2, the first metal film 512 as the third base film 57 thinner than the first base film 51 is formed in the inter-arm region Q4 and the inter-element regions Q5 of the first substrate surface 20A.

Figure 24:
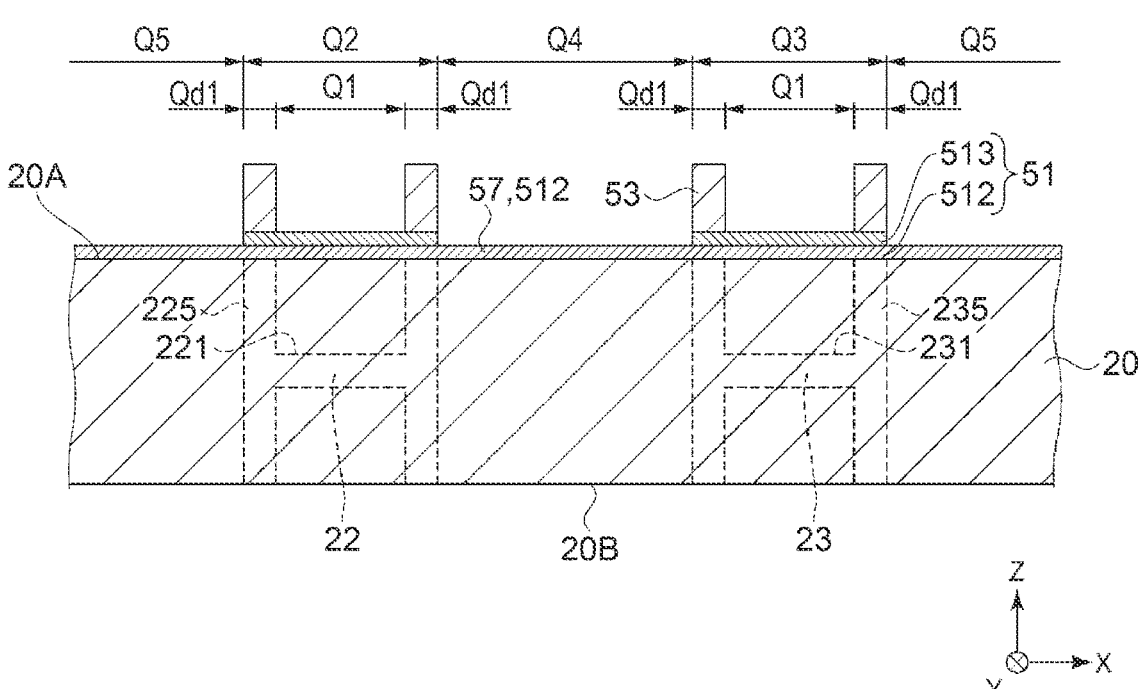
FIG. 24 is a cross-sectional view showing the method for manufacturing the vibration element.

Next, as shown in FIG. 24, the second resist film R2 formed in the first vibrating arm forming region Q2 and the second vibrating arm forming region Q3 is removed, and the process proceeds to the first dry-etching step S4.
First Dry-Etching Step S4

As shown in FIG. 24, in the first dry-etching step S4, the dry-etching is started in the state where the first metal film 512 as the third base film 57 is formed in the inter-arm region Q4 and the inter-element regions Q5. Other than this, the first dry-etching step S4 is the same as that of the first embodiment.

In the first dry-etching step S4, the first metal film 512 as the third base film 57 is etched in the same manner as the first base film 51 and the first protective film 53. Therefore, even when the first metal film 512 as the third base film 57 is formed in the inter-arm region Q4 and the inter-element regions Q5, the outer shapes of the first and second vibrating arms 22, 23 and the first grooves 221, 231 can be collectively formed in the first dry-etching step S4 as shown in FIG. 25.

Even when the first metal film 512 is formed in the inter-arm region Q4 and the inter-element regions Q5, the outer shapes of the first and second vibrating arms 22, 23 and the first grooves 221, 231 can be collectively formed, and thus the step of etching the first metal film 512 in the first base film patterning step S22 is not necessary. That is, the steps for manufacturing the vibration substrate 2 can be reduced.

When the first dry-etching step S4 is ended, the process proceeds to the first base film removing step S5.

Figure 25:
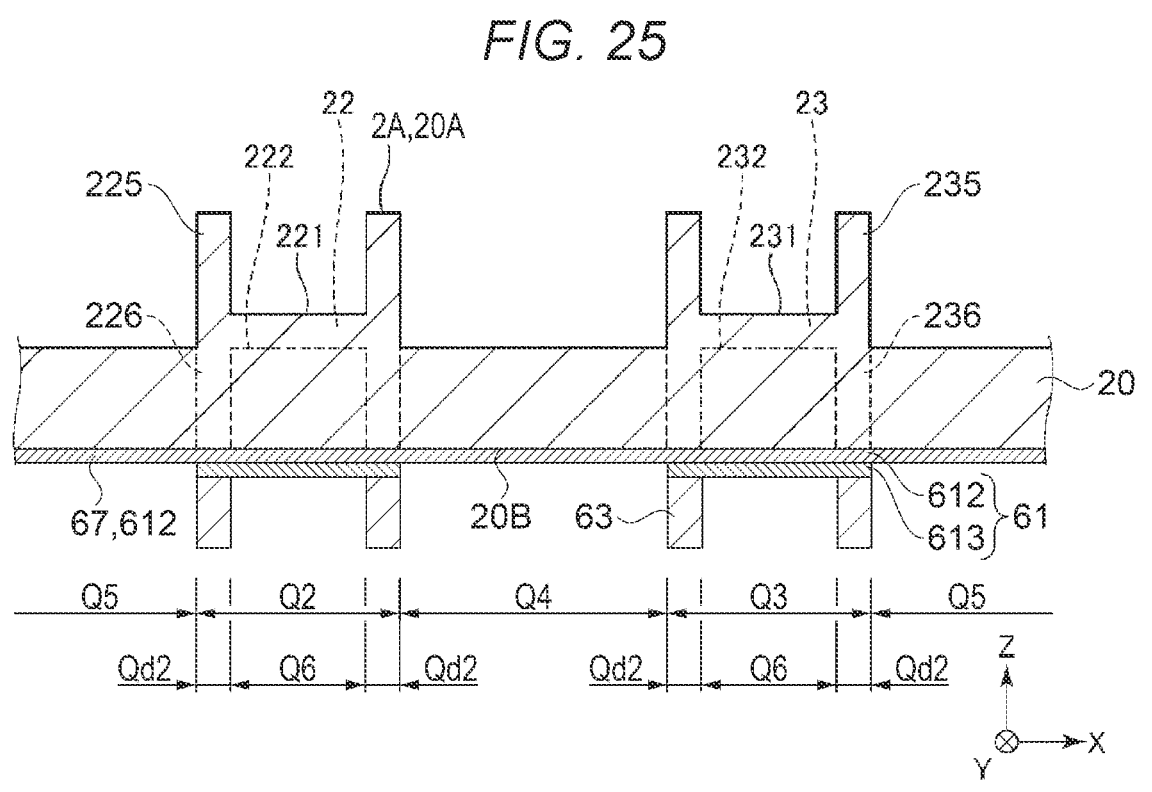

In the present embodiment, the first dry-etching step S4 is ended in the state where the first base film 51 remains on the first substrate surface 20A of the quartz crystal substrate 20 in the first bank portion forming regions Qd1, but the first base film 51 remaining on the first substrate surface 20A of the quartz crystal substrate 20 is removed in the first base film removing step S5 and is not shown in FIG. 25.

The first base film removing step S5, the second base film coating step S61, the second protective film coating step S71, and the second protective film patterning step S72 are the same as those in the first embodiment, and thus the description thereof is omitted, and the method will be described from the second base film patterning step S62.
Second Base Film Patterning Step S62

As shown in FIG. 25, similarly to the first base film patterning step S22, the fourth metal film 613 of the second base film 61 in the inter-arm region Q4 and the inter-element regions Q5 is removed by the photolithographic technique and an etching technique. In addition, the second base film 61 is formed in the first vibrating arm forming region Q2 and the second vibrating arm forming region Q3 on the second substrate surface 20B of the quartz crystal substrate 20.

In the inter-arm region Q4 and the inter-element regions Q5, the fourth metal film 613 of the second base film 61 is removed, but the third metal film 612 is not removed. That is, the third metal film 612 is formed in the inter-arm region Q4 and the inter-element regions Q5 of the second substrate surface 20B of the quartz crystal substrate 20. The third metal film 612 formed in the inter-arm region Q4 and the inter-element regions Q5 of the second substrate surface 20B of the quartz crystal substrate 20 corresponds to the fourth base film 67. In other words, in the second base film forming step S6, the third metal film 612 as the fourth base film 67 thinner than the second base film 61 is formed in the inter-arm region Q4 and the inter-element regions Q5 of the second substrate surface 20B.
Second Dry-Etching Step S8

As shown in FIG. 25, in the second dry-etching step S8, the dry-etching is started in the state where the third metal film 612 as the fourth base film 67 is formed in the inter-arm region Q4 and the inter-element regions Q5. Other than this, the second dry-etching step S8 is the same as that of the first embodiment.

In the second dry-etching step S8, the third metal film 612 as the fourth base film 67 is etched in the same manner as the second base film 61 and the second protective film 63. Therefore, even when the third metal film 612 as the fourth base film 67 is formed in the inter-arm region Q4 and the inter-element regions Q5, the outer shapes of the first and second vibrating arms 22, 23 and the second grooves 222, 232 can be collectively formed in the second dry-etching step S8.

Even when the third metal film 612 is formed in the inter-arm region Q4 and the inter-element regions Q5, the outer shapes of the first and second vibrating arms 22, 23 and the second groove 222, 232 can be collectively formed, and thus the step of etching the third metal film 612 in the second base film patterning step S62 is not necessary. That is, the steps for manufacturing the vibration substrate 2 can be reduced.

When the second dry-etching step S8 is ended, the process proceeds to the second base film removing step S9.

By the above steps S1 to S9, as shown in FIG. 20, a plurality of vibration substrates 2 are collectively formed from the quartz crystal substrate 20.

Since the second base film removing step S9 and the electrode forming step S10 are the same as those of the first embodiment, the description thereof will be omitted.

According to the present embodiment, following effects can be obtained in addition to the effects of the first embodiment.

Even when the first metal film 512 as the third base film 57 is formed in the inter-arm region Q4, the outer shapes of the first and second vibrating arms 22, 23 and the first grooves 221, 231 can be collectively formed in the first dry-etching step S4. In addition, even when the third metal film 612 as the fourth base film 67 is formed in the inter-arm region Q4, the outer shapes of the first and second vibrating arms 22, 23 and the second grooves 222, 232 can be collectively formed in the second dry-etching step S8. In addition, the steps of removing the first metal film 512 and the third metal film 612 are not necessary, so that the steps for manufacturing the vibration substrate 2 can be reduced.

In the present embodiment, in the first base film patterning step S22, the first metal film 512 as the third base film 57 is formed in the inter-arm region Q4 and the inter-element regions Q5 of the first substrate surface 20A of the quartz crystal substrate 20, but the first metal film 512 as the third base film 57 may not be formed. That is, as in the first embodiment described above, the first base film 51 may not be formed in the inter-arm region Q4 or the inter-element regions Q5 of the first substrate surface 20A. When the first base film 51 is not formed in the inter-arm region Q4 or the inter-element regions Q5 of the first substrate surface 20A, the first substrate surface 20A of the quartz crystal substrate 20 is exposed in the inter-arm region Q4 and the inter-element regions Q5, and thus as compared with the case where the first metal film 512 as the third base film 57 is formed, the first dry-etching step S4 can be ended in a short time.

In the present embodiment, in the second base film patterning step S62, the third metal film 612 as the fourth base film 67 is formed in the inter-arm region Q4 and the inter-element regions Q5 of the second substrate surface 20B of the quartz crystal substrate 20, but the third metal film 612 as the fourth base film 67 may not be formed. That is, as in the first embodiment described above, the second base film 61 may not be formed in the inter-arm region Q4 or the inter-element regions Q5 of the second substrate surface 20B. When the second base film 61 is not formed in the inter-arm region Q4 or the inter-element regions Q5 of the second substrate surface 20B, the second substrate surface 20B of the quartz crystal substrate 20 is exposed in the inter-arm region Q4 and the inter-element regions Q5, and thus as compared with the case where the third metal film 612 as the fourth base film 67 is formed, the second dry-etching step S8 can be ended in a short time.

That is, the third base film 57 or the fourth base film 67 may be formed in at least one of the inter-arm region Q4 of the first substrate surface 20A and the inter-arm region Q4 of the second substrate surface 20B. In addition, the third base film 57 or the fourth base film 67 may be formed in at least one of the inter-element regions Q5 of the first substrate surface 20A and the inter-element regions Q5 of the second substrate surface 20B.

In other words, the first base film 51 or the second base film 61 may not be formed in at least one of the inter-arm region Q4 of the first substrate surface 20A and the inter-arm region Q4 of the second substrate surface 20B. In addition, the first base film 51 or the second base film 61 may not be formed in at least one of the inter-element regions Q5 of the first substrate surface 20A and the inter-element regions Q5 of the second substrate surface 20B.

The method for manufacturing a vibration element according to the present disclosure has been described above based on the first embodiment, the second embodiment, and the third embodiment.

The vibration element manufactured by the method for manufacturing a vibration element according to the present disclosure is not particularly limited.

Figure 26:
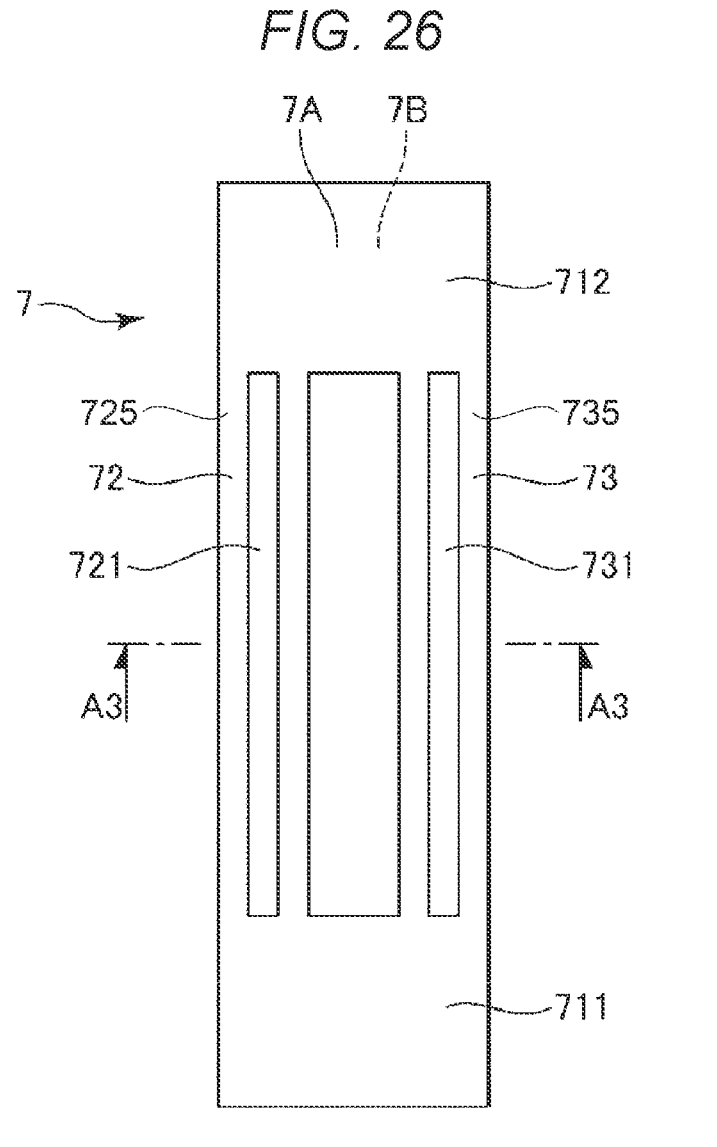
FIG. 26 is a plan view showing a modification of the vibration element.
Figure 26:
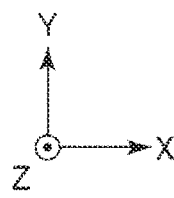
Figure 27:
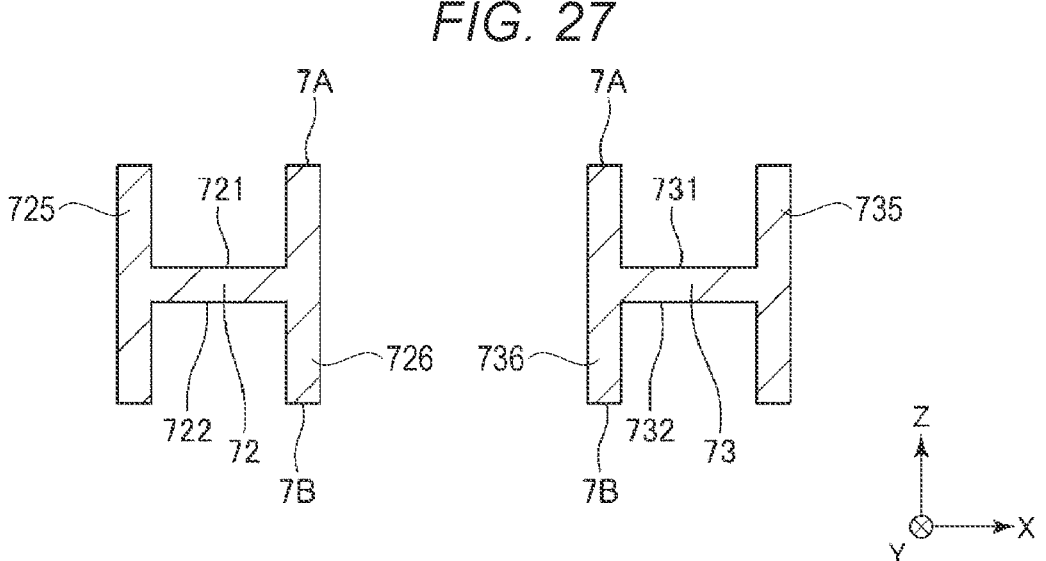
FIG. 27 is a cross-sectional view taken along a line A3-A3 in FIG. 26.

The vibration element manufactured by the method for manufacturing a vibration element according to the present disclosure may be, for example, a dual tuning fork type vibration element 7 as shown in FIGS. 26 and 27. Electrodes are not shown in FIGS. 26 and 27. The dual tuning fork type vibration element 7 includes a pair of base portions 711, 712, and a first vibrating arm 72 and a second vibrating arm 73 coupling the base portions 711, 712. In addition, the first vibrating arm 72 and the second vibrating arm 73 respectively include bottomed first grooves 721, 731 that open to a first surface 7A, bottomed second grooves 722, 732 that open to a second surface 7B, first bank portions 725, 735 that demarcate the first grooves 721, 731, and second bank portions 726, 736 that demarcate the second grooves 722, 732.

Figure 28:
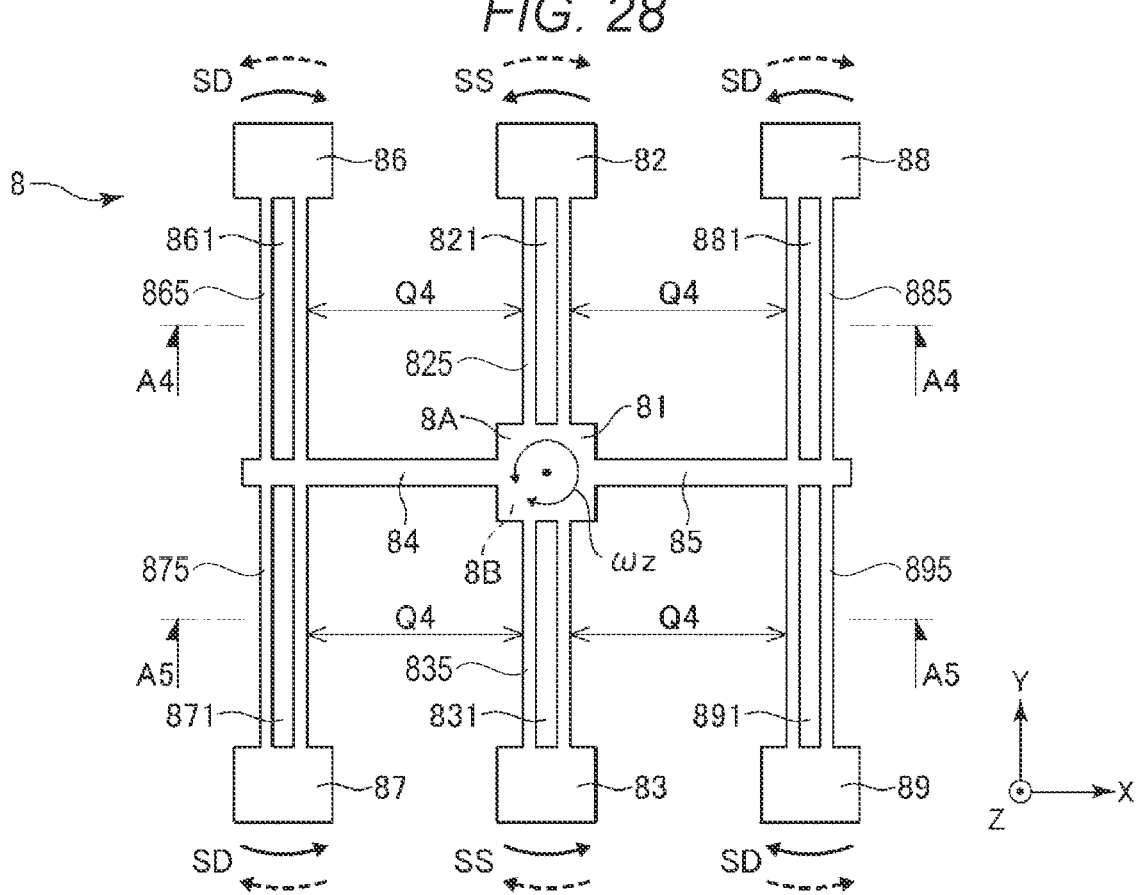
FIG. 28 is a plan view showing a modification of the vibration element.
Figure 29:
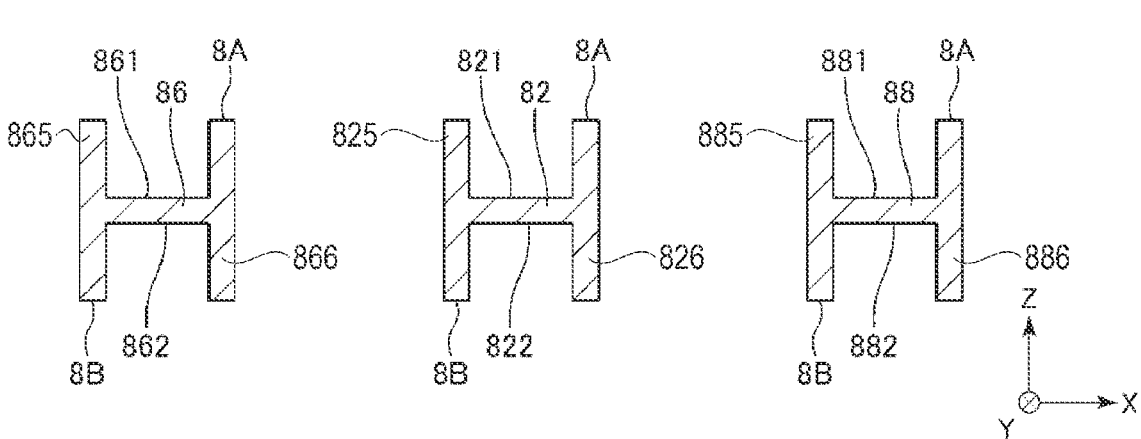
FIG. 29 is a cross-sectional view taken along a line A4-A4 in FIG. 28.
Figure 30:
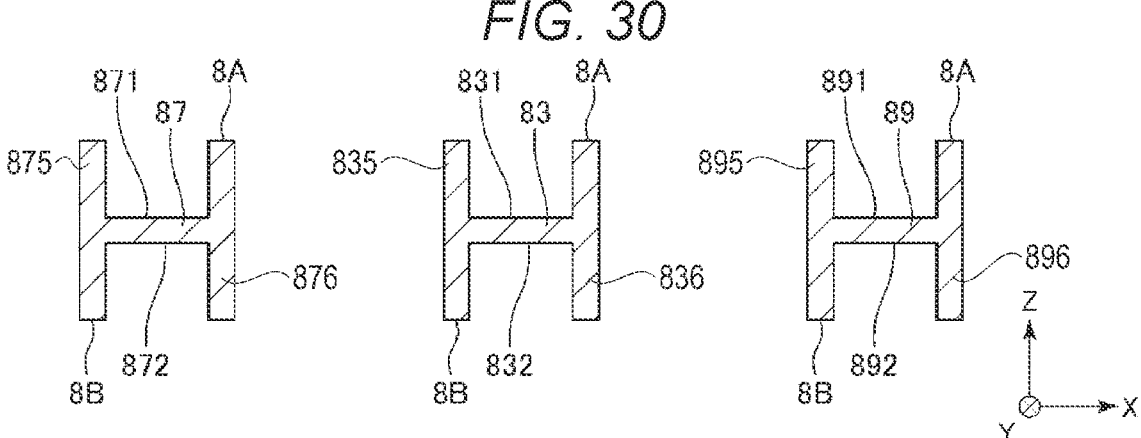
FIG. 30 is a cross-sectional view taken along a line A5-A5 in FIG. 28.

In addition, for example, the vibration element may be a gyro vibration element 8 as shown in FIGS. 28, 29, and 30. In FIGS. 28, 29, and 30, electrodes are not shown. The gyro vibration element 8 includes a base portion 81, a pair of detection vibration arms 82, 83 extending from the base portion 81 to both sides in the Y direction, a pair of coupling arms 84, 85 extending from the base portion 81 to both sides in the X direction, drive vibration arms 86, 87 extending from a tip end portion of the coupling arm 84 to both sides in the Y direction, and drive vibration arms 88, 89 extending from a tip end portion of the coupling arm 85 to both sides in the Y direction. In the gyro vibration element 8 described above, when an angular velocity ωz around the Z axis is applied in a state where the drive vibration arms 86, 87, 88, 89 perform flexural vibration in a direction of an arrow SD in FIG. 28, flexural vibration in a direction of an arrow SS is newly excited in the detection vibration arms 82, 83 by a Coriolis force, and the angular velocity ωz is detected based on electric charges output from the detection vibration arms 82, 83 by the flexural vibration.

In addition, the detection vibration arms 82, 83 include bottomed first grooves 821, 831 that open to a first surface 8A, bottomed second grooves 822, 832 that open to a second surface 8B, first bank portions 825, 835 that demarcate the first grooves 821, 831, and second bank portions 826, 836 that demarcate the second grooves 822, 832. The drive vibration arms 86, 87, 88, 89 include bottomed first grooves 861, 871, 881, 891 that open to the first surface 8A, bottomed second grooves 862, 872, 882, 892 that open to the second surface 8B, first bank portions 865, 875, 885, 895 that demarcate the first grooves 861, 871, 881, 891, and second bank portions 866, 876, 886, 896 that demarcate the second grooves 862, 872, 882, 892. In the gyro vibration element 8 described above, for example, the drive vibration arms 86, 88 or the drive vibration arms 87, 89 are the first vibrating arms and the second vibrating arms.

Figure 31:
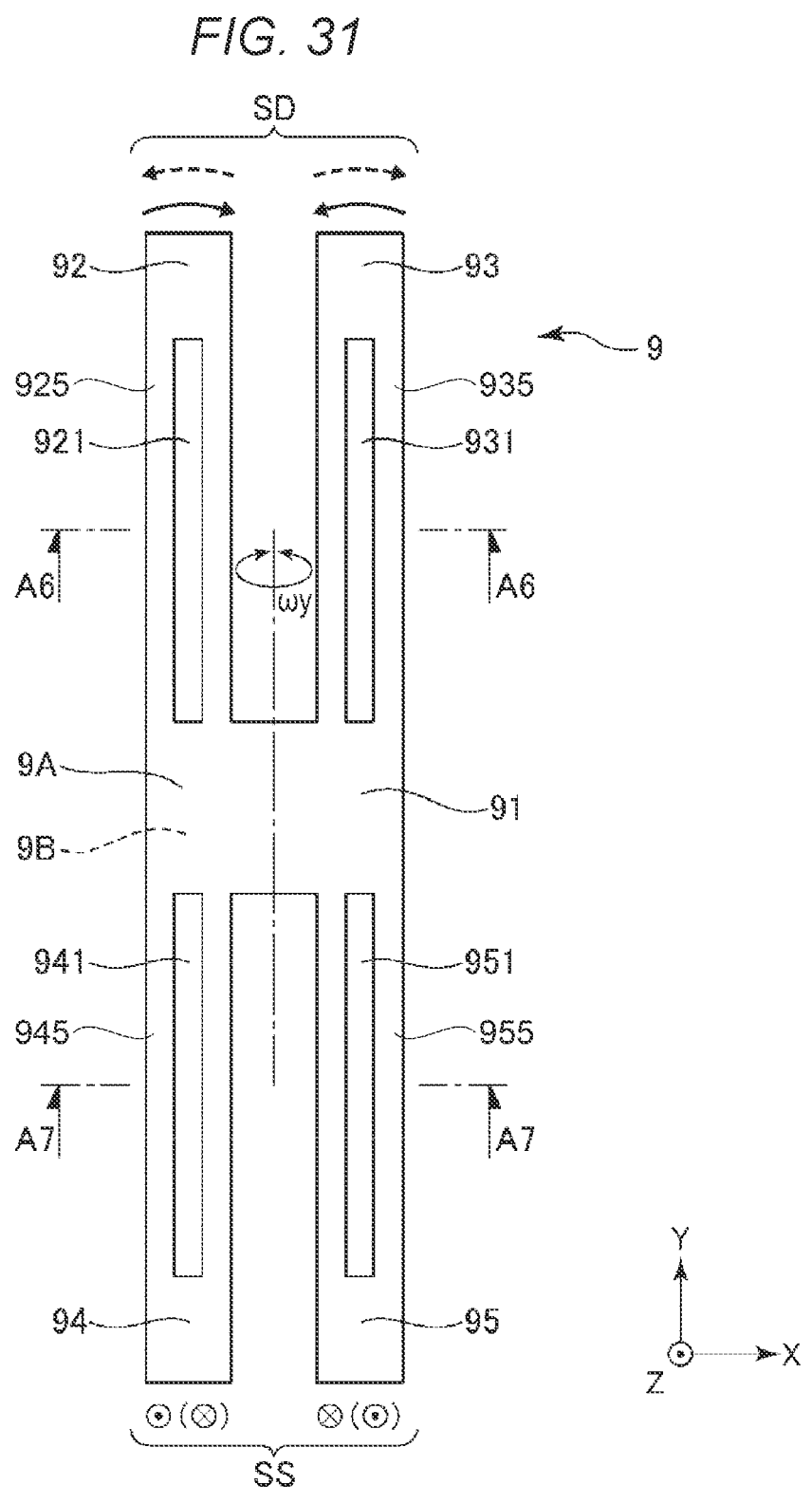
Figure 32:
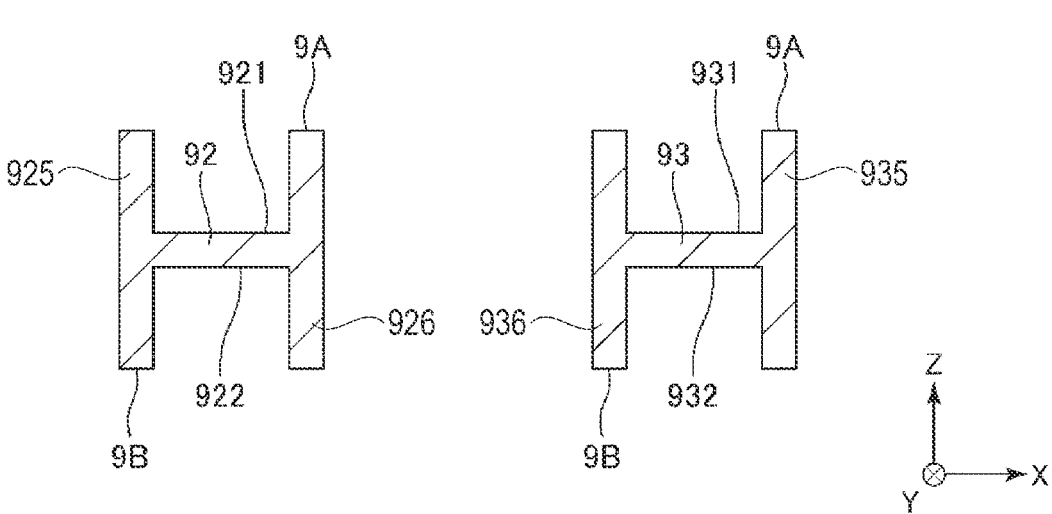
FIG. 32 is a cross-sectional view taken along a line A6-A6 in FIG. 31.
Figure 33:
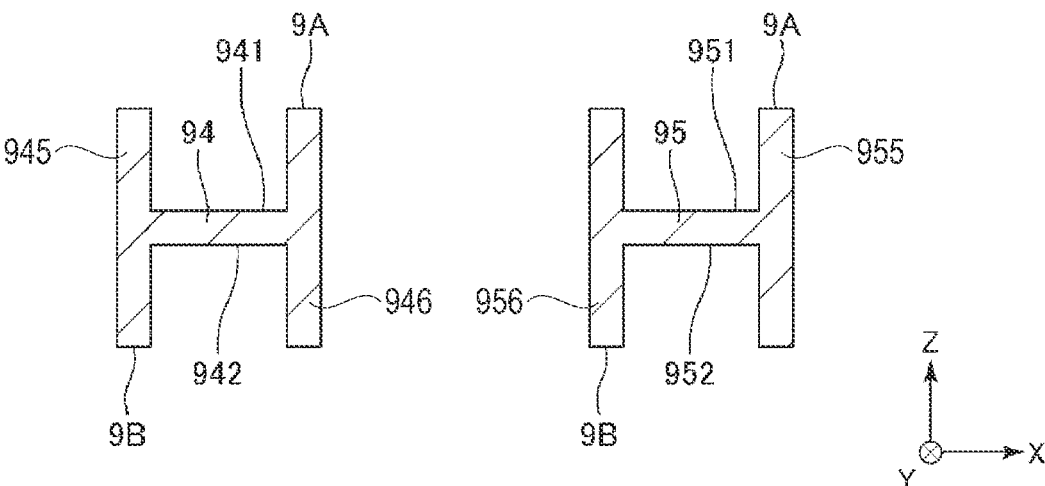
FIG. 33 is a cross-sectional view taken along a line A7-A7 in FIG. 31.

In addition, for example, the vibration element may be a gyro vibration element 9 as shown in FIGS. 31, 32, and 33. In FIGS. 31, 32, and 33, electrodes are not shown. The gyro vibration element 9 includes a base portion 91, a pair of drive vibration arms 92, 93 extending from the base portion 91 to the plus side in the Y direction and arranged side by side in the X direction, and a pair of detection vibration arms 94, 95 extending from the base portion 91 to the minus side in the Y direction and arranged side by side in the X direction. In the gyro vibration element 9 described above, when an angular velocity ωy around the Y axis is applied in a state where the drive vibration arms 92, 93 perform flexural vibration in a direction of an arrow SD in FIG. 31, flexural vibration in a direction of an arrow SS is newly excited in the detection vibration arms 94, 95 by a Coriolis force, and the angular velocity ωy is detected based on electric charges output from the detection vibration arms 94, 95 by the flexural vibration.

In addition, the drive vibration arms 92, 93 include bottomed first grooves 921, 931 that open to a first surface 9A, bottomed second grooves 922, 932 that open to a second surface 9B, first bank portions 925, 935 that demarcate the first grooves 921, 931, and second bank portions 926, 936 that demarcate the second grooves 922, 932. In addition, the detection vibration arms 94, 95 include bottomed first grooves 941, 951 that open to the first surface 9A, bottomed second grooves 942, 952 that open to the second surface 9B, first bank portions 945, 955 that demarcate the first grooves 941, 951, and second bank portions 946, 956 that demarcate the second grooves 942, 952. In the gyro vibration element 9 described above, the drive vibration arms 92, 93 or the detection vibration arms 94, 95 are the first vibrating arms and the second vibrating arms.

What is claimed is:

1. A method for manufacturing a vibration element, that includes a first vibrating arm and a second vibrating arm extending along a first direction and arranged side by side along a second direction intersecting the first direction, the first vibrating arm and the second vibrating arm each having a first surface and a second surface arranged side by side in a third direction intersecting the first direction and the second direction in a front and back relationship, a bottomed first groove opening to the first surface, and a bottomed second groove opening to the second surface, the method comprising steps of:

providing a quartz crystal substrate having a first substrate surface and a second substrate surface in a front and back relationship, a first vibrating arm forming region in which the first vibrating arm is to be formed, a second vibrating arm forming region in which the second vibrating arm is to be formed, a first groove forming region in which the bottomed first groove is to be formed, a second groove forming region in which the bottomed second groove is to be formed, and an inter-arm region that is located between the first vibrating arm forming region and the second vibrating arm forming region;

forming a first base film on the first substrate surface in the first vibrating arm forming region and the second vibrating arm forming region;

forming a first protective film in a region of the first base film excluding the first groove forming region;

a first dry-etching of the first substrate surface of the quartz crystal substrate through the first base film and the first protective film to simultaneously form the first surfaces, the bottomed first grooves, and outer shapes of the first vibrating arm and the second vibrating arm;

forming a second base film on the second substrate surface in the first vibrating arm forming region and the second vibrating arm forming region;

forming a second protective film in a region of the second base film excluding the second groove forming region;

a second dry-etching of the quartz crystal substrate at the second substrate surface through the second base film and the second protective film to simultaneously form the second surfaces, the bottomed second grooves, and the outer shapes of the first vibrating arm and the second vibrating arm;

wherein the method for manufacturing the vibration element further comprises:

forming a third protective film that is thinner than the first protective film in the first groove forming region of the first base film; and forming a fourth protective film that is thinner than the second protective film in the second groove forming region of the second base film.

2. The method for manufacturing the vibration element according to claim 1, wherein the forming the first base film or the second base film excludes the inter-arm region of the first substrate surface located between the first vibrating arm forming region and the second vibrating arm forming region and the inter-arm region of the second substrate surface.

3. The method for manufacturing the vibration element according to claim 1, further comprising:

removing the remaining first base film while the first base film remains at the first substrate surface in a state when the first dry-etching is ended.

4. The method for manufacturing the vibration element according to claim 3, further comprising:

removing the remaining second base film while the second base film remains at the first substrate surface in a state when the first dry-etching is ended.

5. The method for manufacturing the vibration element according to claim 1, wherein at least one of the first base film and the second base film is a metal film.

6. A method for manufacturing a vibration element that includes a first vibrating arm and a second vibrating arm extending along a first direction and arranged side by side along a second direction intersecting the first direction, the first vibrating arm and the second vibrating arm each having a first surface and a second surface arranged side by side in a third direction intersecting the first direction and the second direction in a front and back relationship, a bottomed first groove opening to the first surface, and a bottomed second groove opening to the second surface, the method comprising steps of:

providing a quartz crystal substrate having a first substrate surface and a second substrate surface in a front and back relationship, a first vibrating arm forming region in which the first vibrating arm is to be formed, a second vibrating arm forming region in which the second vibrating arm is to be formed, a first groove forming region in which the bottomed first groove is to be formed, a second groove forming region in which the bottomed second groove is to be formed, and an inter-arm region that is located between the first vibrating arm forming region and the second vibrating arm forming region;

forming a first base film on the first substrate surface in the first vibrating arm forming region and the second vibrating arm forming region;

forming a first protective film in a region of the first base film excluding the first groove forming region;

a first dry-etching of the first substrate surface of the quartz crystal substrate through the first base film and the first protective film to simultaneously form the first surfaces, the bottomed first grooves, and outer shapes of the first vibrating arm and the second vibrating arm;

forming a second base film on the second substrate surface in the first vibrating arm forming region and the second vibrating arm forming region;

forming a second protective film in a region of the second base film excluding the second groove forming region;

a second dry-etching of the quartz crystal substrate at the second substrate surface through the second base film and the second protective film to simultaneously form the second surfaces, the bottomed second grooves, and the outer shapes of the first vibrating arm and the second vibrating arm;

wherein the method for manufacturing the vibration element further comprises:

forming a third base film that is thinner than the first base film in the inter-arm region of the first substrate surface; and forming a fourth base film that is thinner than the second base film in the inter-arm region of the second substrate surface.

* * * * *